(12) United States Patent
Vitusevich et al.

(10) Patent No.: US 11,668,672 B2
(45) Date of Patent: Jun. 6, 2023

(54) APPARATUS BASED ON A NANOWIRE CROSS FOR MEASURING SMALL POTENTIALS OF A SAMPLE, METHOD FOR PRODUCING THE APPARATUS, AND USE OF THE APPARATUS

(71) Applicant: FORSCHUNGSZENTRUM JUELICH GMBH, Juelich (DE)

(72) Inventors: Svetlana Vitusevich, Dueren (DE); Ihor Zadorozhnyi, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 1098 days.

(21) Appl. No.: 16/324,157

(22) PCT Filed: Sep. 6, 2017

(86) PCT No.: PCT/DE2017/000286
§ 371 (c)(1),
(2) Date: Feb. 8, 2019

(87) PCT Pub. No.: WO2018/046034
PCT Pub. Date: Mar. 15, 2018

(65) Prior Publication Data
US 2019/0170682 A1 Jun. 6, 2019

(30) Foreign Application Priority Data
Sep. 8, 2016 (DE) .................... 10 2016 010 764.2

(51) Int. Cl.
*G01N 27/414* (2006.01)
*H01L 29/06* (2006.01)
(Continued)

(52) U.S. Cl.
CPC ....... *G01N 27/4146* (2013.01); *H01L 29/068* (2013.01); *H01L 29/78696* (2013.01); *H01L 29/00* (2013.01)

(58) Field of Classification Search
None
See application file for complete search history.

(56) References Cited

U.S. PATENT DOCUMENTS

| 8,106,382 | B2 | 1/2012 | Saitoh et al. | |
| 2010/0297608 | A1* | 11/2010 | Stern | G01N 27/4146 435/7.1 |

(Continued)

FOREIGN PATENT DOCUMENTS

| DE | 102013018850 A1 | 5/2015 |
| JP | 02139973 A | 5/1990 |

(Continued)

OTHER PUBLICATIONS

Soshi Sato, et al., "Effects of corner angle of trapezoidal and triangular channel cross-sections on electrical performance of silicon nanowire field-effect transistors with semi gate-around structure", Solid-State Electronics 65-66, Dec. 2011, pp. 2-8.

(Continued)

*Primary Examiner* — Steven M Christopher
(74) *Attorney, Agent, or Firm* — Leydig, Voit & Mayer, Ltd.

(57) ABSTRACT

An apparatus for measuring electrical potentials of a liquid sample includes at least one field effect transistor having a source, a drain, and a gate, a substrate, and at least two intersecting nanowires of semiconductive material arranged on the substrate, each having a source and drain contact as a field effect transistor and a voltage applicator configured to apply a voltage between the respective source and drain contact. The cross section of the two nanowires has a shape of a triangle or a trapezium. A voltage applicator configured (Continued)

to apply a voltage to the substrate are arranged on the substrate. The nanowires are electrically insulated at least against the sample by a dielectric layer along their surface having a layer thickness between 5 and 40 nm, and at least one impurity is arranged in the dielectric layer as a bearing point which is capable of capturing charge carriers.

10 Claims, 18 Drawing Sheets

(51) Int. Cl.
   *H01L 29/786* (2006.01)
   *H01L 29/00* (2006.01)

(56) References Cited

U.S. PATENT DOCUMENTS

2016/0265047 A1* 9/2016 van Rooyen ..... B01L 3/502715
2016/0274055 A1 9/2016 Vitusevich et al.

FOREIGN PATENT DOCUMENTS

| JP | 2004507104 A | * | 4/2004 |
| JP | 2009264904 A | | 11/2009 |
| JP | 2015127709 A | | 7/2015 |
| WO | WO 2012162271 A2 | | 11/2012 |

OTHER PUBLICATIONS

Jing Li, et al., "Sensitivity Enhancement of Si Nanowire Field Effect Transistor Biosenseors Using Single Trap Phenomena", Nano Lett., vol. 14, May 12, 2014, pp. 3504-3509.

Jing Li, "Transport and Noise Properties of Nanostructure Transistors for Biosensor Applications", Information, vol. 43, Dec. 2015, pp. 1-195.

Sebastien R. Plissard, et al., ,,Formation and electronic properties of InSb nanocrosses, Nature Nanotechnology, vol. 8, Oct. 13, 2013, pp. 859-8164.

Yi Cui, et al., "Functional Nanoscale Electronic Devices Assembled Using Silicon Nanowire Building Blocks", SCIENCE, vol. 291, Feb. 2, 2001, pp. 851-853.

Paolo Livi, et al., "Sensor system including silicon nanowire ion sensitive FET arrays and CMOS readout", Sensors and Actuators B: Chemical, vol. 204, Aug. 15, 2014, pp. 568-577.

Nor F. Za'bah, et al., "Top-down fabrication of single crystal silicon nanowire using optical lithography", Journal of Applied Physics, vol. 112, Jul. 15, 2012, pp. 024309-1-024309-5.

* cited by examiner

1101

APPARATUS BASED ON A NANOWIRE CROSS FOR MEASURING SMALL POTENTIALS OF A SAMPLE, METHOD FOR PRODUCING THE APPARATUS, AND USE OF THE APPARATUS

CROSS REFERENCE TO RELATED APPLICATIONS

This application is a U.S. National Stage Application under 35 U.S.C. § 371 of International Application No. PCT/DE2017/000286 filed on Sep. 6, 2017, and claims benefit to German Patent Application No. DE 10 2016 010 764.2 filed on Sep. 8, 2016. The International Application was published in German on Mar. 15, 2018, as WO 2018/046034 A1 under PCT Article 21(2).

FIELD

The invention relates to an apparatus for measuring small potentials of a sample, a method for producing such an apparatus, and the use of such an apparatus.

BACKGROUND

A field effect transistor is known from DE 10 2013 018 850 A1. It comprises a source, a drain and a gate for measuring small potentials from a sample. The gate is in contact with a liquid sample. It is insulated from the conductive channel of the field effect transistor by a gate dielectric. The apparatus further comprises means for applying a voltage between source and drain and means for applying a bias voltage to the gate. Arranged in the interior of the gate dielectric is at least one bearing point capable of capturing charge carriers from the channel and, conversely, emitting them to the channel. The local potential values at the gate are measured.

Impurities in the channel can falsify the measurements in a disadvantageous manner. A further disadvantage is that the number of bearing points and their positions cannot be precisely controlled. This can also lead to inaccurate measurement results.

SUMMARY

In an embodiment, the present invention provides an apparatus for measuring electrical potentials of a liquid sample. The apparatus includes at least one field effect transistor having a source, a drain, and a gate, a substrate, and at least two intersecting nanowires of semiconductive material arranged on the substrate, each having a source and drain contact as a field effect transistor and a voltage applicator configured to apply a voltage between the respective source and drain contact. A cross section of the two nanowires has a shape of a triangle or a trapezium. A voltage applicator configured to apply a voltage to the substrate is arranged on the substrate. The nanowires are electrically insulated at least against the sample by a dielectric layer along their surface having a layer thickness between 5 and 40 nm, and at least one impurity is arranged in the dielectric layer as a bearing point which is capable of capturing charge carriers from at least one of the two nanowires and, conversely, emitting the charge carriers to the at least one of the two nanowires.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
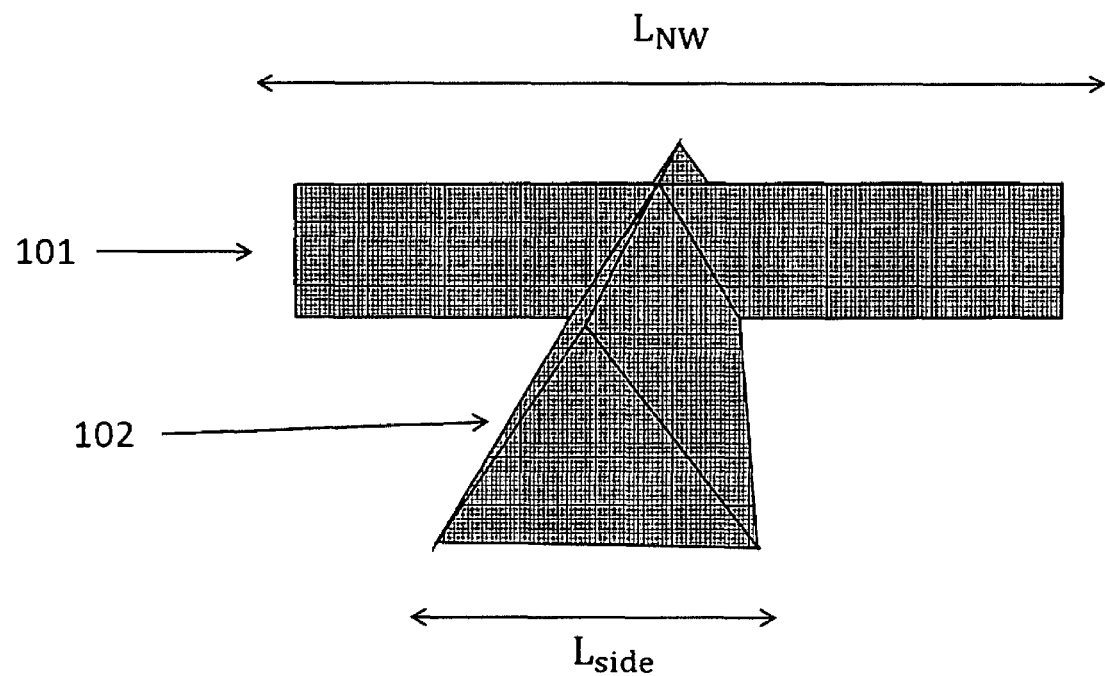
FIGS. 1 *a*) and *b*) illustrate an active region of a field effect transistor.
Figure 1:
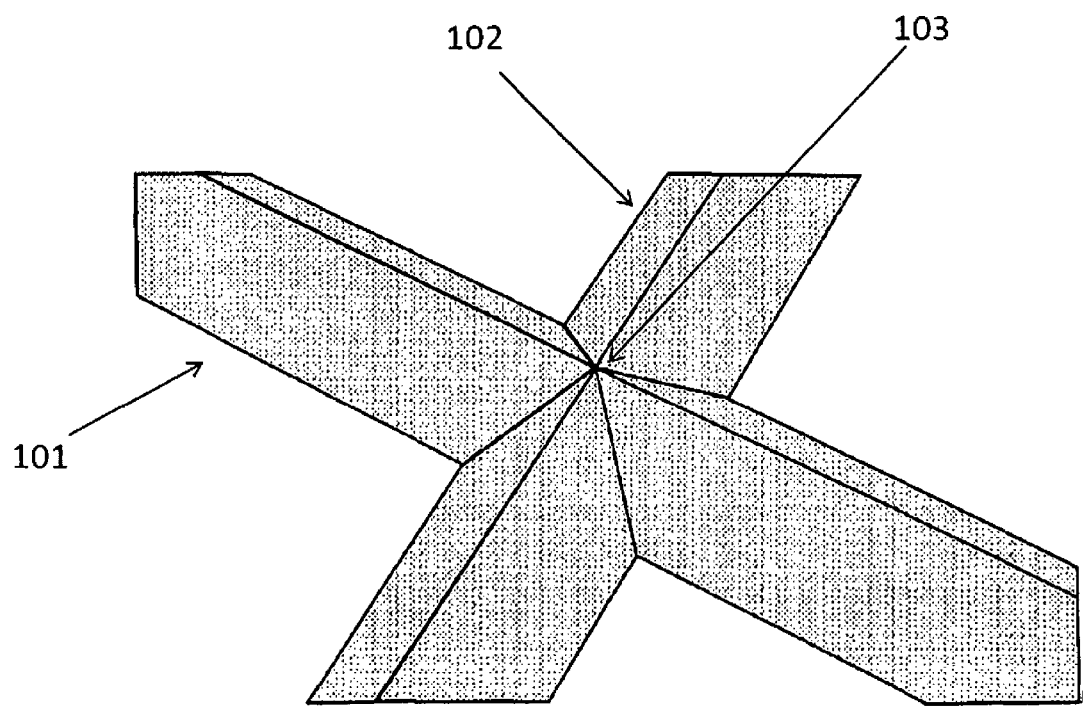

Embodiments of the invention provide apparatuses by means of which changes in electrical potential at a gate can be measured with improved resolution. Further embodiments of the invention provide methods for producing such apparatuses. Still further embodiments of the invention indicate uses for such apparatuses.

The invention provides an apparatus for measuring small potentials of a sample. It comprises at least one field effect transistor with source, drain and gate.

The apparatus is characterized in that it comprises a substrate and at least two intersecting nanowires of semiconductive material arranged on said substrate, each having a source and drain contact with means for applying a voltage between the respective source and drain contact. The cross section of the two nanowires has the shape of a triangle or trapezium. Means for applying a voltage to the substrate are arranged on the substrate.

Although in the simplest version, two intersecting nanowires of a semiconducting material each with a source and drain contact and with means for applying a voltage between the respective source and drain contact are spoken of, it has been found in the context of the invention that it can be advantageous if the two intersecting nanowires each have only two contacts. These can, but need not necessarily, be designed as source and drain contacts.

It has been found that when using the apparatus and the apparatus as such, it can also be advantageous that a voltage is not applied between the two contacts of a single nanowire, as would be the case in the case of a source and drain contact for a nanowire, but if a voltage can also be applied between any contact of the first nanowire and any further contact of the second nanowire. Then intersecting nanowires are understood to have at least one common contact point, for which purpose the nanowires should preferably lie in one plane.

Advantageously, the nanowires are electrically insulated by means of a dielectric layer along their surface at least against the sample, at least one bearing point being arranged in this layer, which is capable of capturing charge carriers from at least one of the two nanowires and, conversely, emitting them to this nanowire.

On the dielectric layer, a platelet of metal may be disposed on each nanowire on each side of the respective nanowire around the common intersection region of the nanowires, wherein opposing platelets each form an antenna, in particular a bowtie antenna.

Thus, the apparatus includes a substrate and at least two intersecting nanowires made of semiconductive material, in particular each having a source and a drain contact with means for applying a voltage between the respective source and drain contacts. The nanowires are electrically insulated at least against the sample by a dielectric layer along their surface. In this dielectric layer, there is therefore at least one bearing point arranged, which is able to capture charge carriers from at least one of the two nanowires and, conversely, to emit them to this nanowire.

At least one nanowire, preferably both nanowires, each have the shape of a triangle or trapezium in cross section and means for applying a voltage to the substrate are arranged on the substrate.

Advantageously, a current of charge carriers, in particular holes, is then caused to flow through at least one nanowire, when a voltage is applied between source and drain.

The accumulation of molecules from the liquid sample at the gate influences the time $\tau_c$, at which a bearing point captures charge carriers from the current in the nanowire, and respectively the time $\tau_e$, at which it emits charge carriers back into the nanowire. This advantageously leads to a change between stronger and weaker current flow, depending on whether the bearing point is occupied by a hole or not. By measuring the current signal, and in particular the times $\tau_e$ and $\tau_c$, at which the current signal changes, which ideally has a profile in the shape of rectangles, the electrical properties, such as e. g. charge distributions, of samples or molecules, in particular biomolecules, such as e. g. cardiac molecules, can be determined well.

Apart from an especially isosceles triangular cross section, the nanowires can also have a trapezoidal cross section. This may make it more difficult to arrange the bearing point at an exact position on the nanowire, for example due to the larger surface area of the nanowire with a trapezoidal cross section compared to a nanowire with a triangular cross section and a comparable side length.

In both a trapezoidal and a triangular cross section of the nanowire, the number of bearing points increases with the intensity of the laser used.

In particular, the substrate comprises the layers of the field-effect transistor on which the nanowires are arranged. Increasing the voltage at the substrate may advantageously cause the current flow, which at low voltage extends across the entire cross section of the nanowire, to be shifted into the tip of the triangular or trapezoidal cross section of the at least one nanowire. This is particularly advantageous in that the current encounters less material-related impurities in the material which cannot be avoided due to the process and which cause a scattering of the charge carriers in the current from source to drain.

In a particularly advantageous manner, the entire current flow is caused to be shifted closer to the bearing points, that is to say into the tip of the nanowire(s) towards the dielectric layer. As a result, potential values at the bearing points can be measured much more sensitively than is known from the prior art.

Furthermore, a transition from a three-dimensional current flow to a one-dimensional current flow is effected. As a result, possible scattering processes at material-related impurities which cause a falsification of the signal are even more reduced in a particularly advantageous manner.

Hence, by applying a suitable voltage to the nanowires, in a particularly advantageous embodiment of the invention, the charge carriers can also be captured in the intersection region of the nanowires, which corresponds to a zero-dimensional current flow.

The field effect transistor comprises at least one, better at least two nanowires, which intersect, so that at least a portion of a nanowire also comprises a portion of the other nanowire. This portion forms an intersection region. A bearing point can be arranged in a targeted manner at this intersection region, e. g., by means of a laser.

A current can then be generated by applying a voltage to a first nanowire and part of the current can be directed into the second nanowire by applying a lower voltage to said second nanowire. This allows the current flow to be advantageously adjusted in such a way that it flows past the bearing points which, due to the process, are not exactly in the center of the intersection region or common portion of the nanowires, but are arranged, for example, on one of the lateral surfaces of a nanowire.

The largest part of the current flow near the intersection region within the cross-section can thus be shifted closer to the accumulating point. Due to the greater current flow in the vicinity of the bearing points, changes in the current flow and the capture times $\tau_c$ can be measured with greater resolution.

Typically, the width $L_{side}$ of a nanowire in the inventive apparatus is between 20 nm and 150 nm, the height $L_{height}$ between 20 nm and 100 nm and the length $L_{NW}$ between 100 nm and 10 µm. Of course, all intermediate values can be set.

Typically, the bearing points are arranged at an average distance of about 100 nm on a $SiO_2$ layer grown on a substrate, wherein the substrate may also comprise $SiO_2$. Since they serve for capturing and emitting charge carriers, they can also be regarded as traps of charge carriers, in particular individual charge carriers.

For many liquid biological samples, it is necessary to apply a voltage to the gate and the liquid sample arranged in the gate, so that the charge exchange between the bearing point and the current flow through the nanowire takes place or takes place at an increased frequency. The combination of a gate, in particular an electrode through which a voltage can be applied to the liquid, and the liquid, is also referred to as a "liquid gate".

A particularly advantageous embodiment of the apparatus is characterized in that a platelet made of metal is arranged on the dielectric layer on each nanowire on each side of the respective nanowire around the intersection region, wherein opposing platelets each form an antenna, in particular a bowtie antenna. A layer of titanium or nickel may be disposed between the metal platelet and the nanowire to suppress diffusion processes.

The side length of the platelets is generally from 50 nm to 70 nm. The distance between the tip of the triangular plate facing the intersection region and the opposite side of this tip is also typically 50 nm to 70 nm. The distance between the tips of two platelets facing each other, which form a bowtie antenna, is typically between 10 nm and 70 nm, wherein again all intermediate values can be adopted.

The advantage of this is that incident radiation, especially laser radiation, can be better focused in order to generate the bearing points. This allows for a good positioning of the bearing points.

A bearing point can then be generated specifically for the measurement at a desired position or, in the case of several bearing points, a bearing point can be selected specifically using their known positions. Then the current flow, in its flow direction and height in the cross-section of the nanowire, can be adjusted in such a way that it interacts mainly or exclusively with this bearing point. Thus, a current signal can be determined as a result of the interaction with the bearing point, which does not, as in the state of the art, comprise a superimposition of the current signals of several bearing points. This makes it possible to measure the changes between strong and weak current signals and the times of these changes and also the associated time constants with a much higher resolution.

The electromagnetic radiation is particularly well focused in the center of a bowtie antenna, so that the bearing point can be very precisely attached to the intersection region or its center. The metal platelets can in particular comprise gold platelets in a triangular shape. The surface of the platelets may be parallel to the surface of the nanowires or be shaped in a planar manner. This depends on the thickness of the gold platelets. Essential for the focusing of electromagnetic radiation is a sharp tip of the platelets in the direction of the intersection region and a side length of the platelets of typically 10 nm to 70 nm, wherein any intermediate value can be assumed.

The wavelength of the laser radiation can be selected such that the dielectric layer on the surface of the nanowires, in particular the $SiO_2$ layer, is transparent with respect to the radiation. The wavelength of the radiation may be 785 nm, for example. The laser beam can then be focused on a location on the intermediate layer between the nanowire and the dielectric layer, so that a bearing point is created precisely at the surface of the nanowire. Said bearing point may include a defect in the crystal structure generated by the laser.

For example, in an exemplary use of a $SiO_2$ layer as a dielectric layer, oxygen atoms can be removed by the laser at the interface between the nanowires and the dielectric layer, leaving ionized silicon oxygen molecules. These can have different charge numbers for different bearing points, depending on how many oxygen atoms have been removed.

An advantageous embodiment of the apparatus is characterized in that at least one nanowire is doped, in particular that one nanowire has a different doping than another nanowire. In the intersection region, this advantageously makes it possible for at least one of the two wires in at least one layer with a height of 1 nm to 5 nm to have a different doping concentration or a different doping type than the remaining nanowire. The charge transport is then advantageously performed via a tunnel process. Particularly sharp maxima then advantageously occur in the current-voltage characteristic curve. This makes it particularly easy to allocate a current value measured close to one of the maxima to a potential value at the bearing point.

In an advantageous embodiment, the apparatus has a different width and/or height in at least one section of at least one nanowire than the rest of this nanowire.

Herewith, it can be advantageously achieved that the current in the area of the bearing point exhibits a particularly high change in density and changes particularly sharply depending on the charge at the bearing point. Due to the sharp changes in current, the capture and emission times at the bearing points can be measured more accurately.

In an advantageous embodiment, the apparatus comprises a passivation layer for the leads and the electrical contacts. Advantageously, a passivation layer protects the electrical contacts and leads from liquid samples.

The area of the cross section in which the current flow takes place can be advantageously influenced by the voltage set at the gate in such a way that the current flow is shifted in the direction of the substrate. The area of the cross section of the semiconductor in which the current flow takes place is shifted away from the tip. Simultaneously, it can be shifted away from the lower region of the nanowire that is opposite the tip by means of the voltage applied to the substrate. The current flow then takes place only in a narrow region of the cross section of the nanowire, which can be shifted within the cross section by means of the applied voltages. This makes it possible to better determine the spatial profile of the potential in the vicinity of the bearing point.

In the context of the application, an edge of a surface or a structure is to be understood in particular as a section of the border of the surface or structure through which two corner points of this surface are interconnected. Opposite edges of the surface should be understood in particular as those edges which merge into each other by an axis reflection at the longitudinal axis or symmetry axis of an axisymmetric surface. Quadrants are to be understood in particular as the four sections of a plane, each of which is delimited by two perpendicular axes, in particular longitudinal axes. Two diametrical points are to be understood in particular as two points which lie on a circle and whose connecting path passes through the center point of this circle. The same should apply to diametrically opposed edges, surfaces or quadrants.

A method according to the invention for producing an apparatus for measuring small potentials of a sample comprising at least one field effect transistor with source, drain and gate is characterized by the steps:

a semiconductive layer is arranged on a substrate,
the pattern of a mask having a cross-shaped structure is transferred into the semiconducting layer,
after the transmission of the pattern of the mask, at least two intersecting semiconducting nanowires are arranged in an anisotropic etching process, the two nanowires each having the shape of a triangle or trapezium in cross section,
source and drain contacts are arranged on each nanowire,
means for applying a voltage to the substrate are arranged on the substrate.

In one embodiment of the invention, the method comprises at least two etching steps using a respective mask in each etching step.

A dielectric layer can be arranged on the surface of the nanowires, and at least one bearing point can be arranged in this dielectric layer which is capable of capturing charge carriers from at least one of the two nanowires and, conversely, emitting them to this nanowire.

A method for producing an apparatus for measuring small potentials of a sample having at least one field effect transistor having a source, a drain and a gate is characterized in that the pattern of a mask is transferred to a semiconducting layer. After the transmission of the pattern of the mask, at least two intersecting semiconductive nanowires are arranged by means of an anisotropic etching process, which has one, two or more etching steps using a respective mask in each etching step, on the surface of each of said nanowires a dielectric layer being disposed, and at least one bearing point is arranged in this dielectric layer, which bearing point is able to capture charge carriers from at least one of the two nanowires and conversely emit them to this nanowire, the two nanowires each having the shape of a triangle or trapezium in cross section. Moreover, source and drain contacts are arranged on each nanowire. Furthermore, means for applying a voltage to the substrate are arranged on the substrate.

The nanostructured field-effect transistor produced using this method can be used to advantageously measure the electrical properties of biomolecules and liquid biological samples with high resolution.

Incidentally, a method according to the invention is characterized by the following steps:

a) At least one semiconducting layer is arranged on a substrate.
b) A pattern of a virtual or physical mask is provided, said pattern comprising two axially symmetrical structures along their longitudinal axis which intersect and each have at least one overall or sectional rectangular or square shape.
c) An etchant which anisotropically etches the material of the semiconducting layer is applied to at least one edge of a surface on the semiconducting layer which is congruent with the total surface of the pattern.
d) Step c) is repeated for opposite edges of the border of the surface mentioned in step c) until at least two intersecting nanowires of triangular or trapezoidal cross-section are arranged along the longitudinal axes of the surface with a source and/or drain elevation arranged at each end of the nanowires.
e) A dielectric layer is arranged along the surface of the nanowires.
f) At least one bearing point is arranged in the dielectric layer along the surface of the wires.
g) The elevations intended for drain and source and the substrate are electro-conductively connected with means for applying a voltage.

In accordance with the invention, it was discovered that the process described in steps a) to g) could advantageously also produce structures with multiple nanowires having triangular or trapezoidal cross-sections, which are not parallel to each other. Methods for producing nanowires in such a geometry from the same material and from the same single crystal are not known from the prior art.

In anisotropic etching, differently oriented crystal planes are etched with different intensity and speed. This advantageously allows the desired anisotropic structures to be generated. The designation of the crystal axes and crystal planes such as the {1 0 0} plane is made using the known Miller indices. The lithographic process can be carried out for the application of various structures with photolithography and/or with electron beams. For example, the structures for the electrical contacts can be arranged with photon beams and for the nanowires with electron beams. For a necessary passivation, e. g. of nanowires, contacts or supply lines, PI 4525 passivation material can be used, which can be completely removed with alkaline developers. The structure can then be hardened and stabilized in a so-called hard bake procedure.

In the case of using electron beams for lithography, the e-beam lithography, a virtual mask on the computer is used rather than a physical mask. The mask is also a pattern which is scanned by the electron beams. Such a pattern can be created by computer programs known from the prior art.

To produce the nanowire, it can be advantageously possible to use a method which is not known from the prior art with a plurality of etching steps, in which the borders of the surface in which the at least two nanowires are to be arranged are etched only in diametrically opposed quadrants in each etching step. For this purpose a mask is used in each etching step, which mask comprises the total surface area of the pattern and two further surface areas which are arranged in diametrically opposed quadrants which are delimited by the two longitudinal axes of the total surface area of the pattern and together with the partial surface of the pattern form a square or rectangle in the respective quadrant.

Advantageously, the arrangement of at least one semiconducting layer on a substrate in step a) enables the formation of semiconducting nanowires in the course of the method.

Advantageously, in step b), the provision of a pattern comprising two axially symmetrical structures along their longitudinal axis which intersect and which each have at least one overall or sectional rectangular or square shape, enables the arrangement of the nanowires in the desired geometry in the course of the method. The longitudinal axes thus form in particular the symmetry axes of the axisymmetric structures.

Advantageously, in step c), the arrangement of an etchant which anisotropically etches the material of the semiconducting layer on at least one edge of a surface on the semiconducting layer, which is congruent with the total surface area of the pattern, enables an oblique surface to be etched into the semiconducting layer along this edge. As a result, triangular or trapezoidal structures are etched. The etchant can be disposed on only one, on multiple or on all edges simultaneously.

In each case, the etching process can be carried out only until the upper edge of a surface which is etched into the semiconducting layer by the etching process reaches the position of one of the longitudinal axes of the surface mentioned in step c) at the surface of the semiconducting layer.

By repeating the etching process according to step d), the desired geometry of two intersecting nanowires having a triangular or trapezoidal cross-section along the longitudinal axes of the surface and a source or drain elevation arranged at each end of the nanowire can be advantageously arranged at the edges of the first surface. The etching process is carried out according to step d) in each case only until the upper edges of the respective surfaces facing away from the substrate, which are etched by the etching process into the semiconducting layer at the opposite edges of the surface mentioned in step c), meet. After the etching process in a first step initially arranges one half of the nanowire along the respective longitudinal axis on one side, the second half of the nanowire can be arranged on the other side of the longitudinal axis by repeating the etching process in a second step.

If necessary, suitable protective or passivation layers or resist layers are newly arranged at the edges or at the entire layer sequence or even at the contacts before the etching process or etching steps are repeated.

The inclined surfaces mentioned in step c) are moved by the etching processes from opposite directions to the respective longitudinal axis and/or symmetry axis when the etchant is arranged in successive etching steps on opposite edges of the border of the first surface until a nanowire having the desired triangular or trapezoidal cross section is formed.

The etchant is arranged at least at the edges of the first surface, which have no points in common with the longitudinal axes. The etchant can advantageously also be used in a further region of the semiconducting layer which is not within the first surface. This allows the semiconducting layer to be removed in this further region.

Arranging a dielectric layer along the surface of the nanowires according to step e) advantageously causes the surface of the nanowires to be protected, for example from the liquid sample to be examined with the arrangement. Bearing points can be arranged in the dielectric layer in an advantageous manner.

Advantageously, arranging a bearing point in the dielectric layer along the surface of the wires according to step f) makes it possible for the capture time of charges from the current through the nanowire to be measured by the bearing point and thus electrical properties of the sample to be measured.

The electrically conductive connection of the elevations intended for drain and source and the substrate with means for applying a voltage in step g) is particularly advantageous in that a current can flow through the nanowire.

An advantageous method is characterized in that after step b) the arrangement of the etchant according to step c) is carried out in the following sub-steps:
 i) the etchant is arranged at least at a first edge of the surface mentioned in step c), wherein no etchant is arranged at least between the longitudinal axis of this surface which is parallel to the first edge and a second edge opposite the first edge,
 ii) the etchant is removed and subsequently arranged at least at the second edge of the surface, wherein at least between the longitudinal axis from step i) and the first edge no etchant is arranged,
 iii) the etching process in steps i) and ii) is carried out in accordance with step d) mentioned above.

Even by this action alone, improvements over the prior art are provided.

Advantageously, the etchant of step i) can be arranged on at least one first edge of the first surface, and at the same time not be arranged between the opposite edge and the longitudinal axis which runs parallel to the first edge. Advantageously, the etching process for etching an oblique surface can be carried out in a more controlled manner than if the entire edge is etched at the same time. This advantage arises because the etchant does not simultaneously attack the structure to be etched from different sides. Another advantage is that the direction in which the etchant attacks the structure to be etched can also be better controlled. In particular, it can be better controlled along which crystal plane of the semiconducting layer the etching process takes place.

According to step ii), the etchant can be removed again, after an edge of the border has been etched. For example, if the etchant was placed at the edge of the border by immersing the layer sequence in the etchant, the etchant can be removed again by removing it from the etchant. Subsequently, the etchant can be arranged at the second edge of the surface border. In doing so, at least between the longitudinal axis from step i) and the first edge, no etchant is arranged.

Advantageously, in the same way as in step i), an oblique surface is etched into the active layer which is opposite the surface etched in step i) and which is inclined towards it, so that the two surfaces form the border surfaces of a nanowire with a trapezoidal or triangular cross-section.

The etching process at the edges of the surface mentioned in step c) is continued until at least two intersecting nanowires form.

For example, a silicon crystal may be used for the semiconducting layer, which is oriented with its {1 0 0} plane in the direction of the normal of the substrate in the direction of the layer sequence. The etching process can be carried out with the method known to one skilled in the art in the direction of the normal of the {1 1 1} plane, for example with by means of masks within the framework of a lithographic process.

Typically, the etching process in the (1 1 1) crystal plane is about 100 times slower than in the (1 0 0) plane, for example when using tetramethylammonium hydroxide as etchant. In the etching process, an oblique surface is first formed at each border on which the etching process is carried out, the normal of which points in the (1 1 1) direction. With increasing duration of the etching process, this surface is shifted into the interior of the area in the direction of the respective longitudinal axis without changing the direction of the normal.

In accordance with step iii) and/or step d), the etching process is advantageously carried out in each case only until an edge of this surface, which is etched into the semiconducting layer, i. e. in particular its upper edge, reaches, at the level of the surface of the semiconducting layer, the position of one of the longitudinal axes of the first surface, in particular the longitudinal axis towards which the etched surface moves by the etching process.

The etching process can thus advantageously be stopped by methods known to the person skilled in the art, for example by arranging the apparatus in deionized water, when the upper limit line of the etched-in oblique surface, seen from the substrate, reaches the position of the respective longitudinal axes of the surface of the entire pattern. Due to the slow etching rate, the time at which the etching process is to be stopped can be well controlled.

In an advantageous method, the arrangement of the etchant in step c) is carried out using the following steps:
  i) at least one further layer is arranged on the semiconducting layer, said layer comprising a material which can be removed after irradiation with electron beams and/or light beams and/or ion beams,
  ii) a mask is provided which has at least one surface that matches the total surface area of the pattern,
  iii) the further layer is irradiated with electron beams and/or light and/or ion beams through one of the masks,
  iv) the regions of the further layer, which have been irradiated through the mask, are removed,
  v) the etchant is arranged at least on the surface of the semiconducting layer on the surface underneath the removed regions of the further layer,
  vi) the process is continued according to the above step d), wherein the etchant is arranged at the edges of the surface mentioned in step c) in each case after using a mask according to step ii) for irradiation.

The arrangement of a further layer on the semiconducting layer according to step i), which comprises a material which can be removed after irradiation with electron beams and/or light beams and/or ion beams, advantageously permits the protection of selected regions of the semiconducting layer from the etchant in the further process.

Advantageously, providing a mask in step ii), which has at least one area that corresponds to the total surface area of the pattern, enables the protection of the corresponding surface of the further layer against irradiation in the further process.

Irradiation of the further layer with electron beams and/or light and/or ion beams through the mask advantageously allows the irradiated regions to differ from the non-irradiated regions in terms of their chemical or physical characteristics and to be removed in the further process.

By removing the irradiated regions of the further layer, the underlying regions of the semiconducting layer are advantageously exposed, which can be removed in the course of the further process in order to arrange the desired geometry of the nanowires in the semiconducting layer.

These regions are advantageously removed by arranging the etchant at least on the surface of the semiconducting layer. Arranging the etchant along all edges according to step vi), the nanowires having a triangular or trapezoidal cross section in the semiconducting layer are caused to be etched.

In a particularly advantageous process, a mask is provided, which mask comprises the total surface area of the pattern and two further surface areas which are arranged in diametrically opposed quadrants which are delimited by the two longitudinal axes of the total surface area of the pattern and together with the partial surface of the pattern form a square or rectangle in the respective quadrant.

Such a mask is not known from the prior art. When using such a mask, in two diametrically opposed quadrants, the edges of a surface on the further layer, which corresponds to the surface of the pattern, are not irradiated. The quadrants are delimited by the longitudinal axes of this surface. At these edges, the further layer arranged on the semiconducting layer is then also not removed after the irradiation. Consequently, the etchant does not attack the semiconducting layer along this edge. The semiconducting layer is therefore only attacked along the edges which are diametrically opposed to these edges that are protected by the further layer. Then the area, into which the nanowires are to be etched, is not attacked simultaneously at two opposite edges, i. e. at two sections of the border, which merge into each other by an axis reflection at the respective longitudinal and/or symmetry axis. The etching process can therefore be performed in a more controlled manner, than when the region is etched simultaneously from two sides.

In a next step according to the above-mentioned step vi) and/or the above-mentioned step d), a mask of the same type can be used through which the regions of the further layer in the other two diametrically opposed quadrants are irradiated. After removal of these areas, the remaining edges are accessible to the etchant, which are opposite the edges from the previous irradiation and etching step. By arranging the etchant at these edges, the nanowires can then be etched into the semiconducting layer.

A further embodiment of the method is characterized in that the mask provided comprises in each case the total surface area of the pattern and three further surfaces, which each are arranged in a respective quadrant delimited by the two longitudinal axes of the total surface area of the pattern and, together with the partial surface of the pattern, form a square or rectangle in the respective quadrant.

Advantageously, when such a mask is used, the area of the semiconducting layer outside the area, into which the nanowires are to be etched, is irradiated in only one quadrant. Subsequently, the irradiated area can be removed. Only the edge of the first surface in this quadrant is then accessible to the etchant. This advantageously enables an even better controlled etching process.

By using four masks of this type, the portions of the border of the first surface in all four quadrants can be made accessible to the etchant and the nanowires can be etched into the semiconducting layer.

One advantageous method is characterized in that platelets made of metal, in particular gold platelets, are vapor-deposited onto the dielectric layer on the surface of each nanowire.

Advantageously, the deposition of the metal platelets does not destroy the structure of the surface of the nanowire. Vapor-deposited metal platelets are advantageously sufficient for focusing incident radiation for the purpose of creating bearing points. In particular, gold platelets having a triangular shape can be used for this purpose, whereby opposing gold platelets form an antenna, in particular a bowtie antenna.

An advantageous method is characterized in that at least one of the rectangular structures in the pattern of the mask used has different widths in different sections.

Advantageously, the use of rectangular structures in the pattern of the mask having different widths in irradiating the photoresist layer causes the area in which the wire is to be arranged to have different widths in the source-to-drain direction in different sections.

Sections of the nanowire with different heights or widths can then advantageously be produced in the etching process. The height of the nanowire is determined inter alia by the width of the surface which is brought into contact with the etchant, that is to say, in which the wire is to be arranged. In particular, of the at least two nanowires, one may have a different height and width than the other.

An advantageous use is characterized in that the pH of the sample is determined from the time constant $\tau_c$ or the time constant $\tau_e$.

The time constant $\tau_c$ or time constant $\tau_e$ can be determined directly from the time interval in which the drain current assumes the maximum or minimum value. From these time constants, the changes of the values of the local potential at the surface of the dielectric layer can be indicated. The dependence of the time constants on the local potential is influenced by the distance of the impurity from the surface of the respective nanowire. This distance can assume values between 0.2 nm and 2 nm. This small distance and an exact positioning of the impurity can be achieved by using the bowtie antennas. The electrical properties of the respective sample and its pH value can be determined from changes in the above-mentioned local potential.

The apparatus can be used to determine the pH value of the sample from the time constant $\tau_c$ or from the so-called cut-off frequency $f_0=1/\tau_c+1/\tau_e$.

In accordance with DE 10 2013 018 850 A1, the cut-off frequency is the highest frequency with which the current signal can just be transmitted. The pH value is directly correlated with the electrical properties of, for example, biomolecules, organic molecules or biofluids that accumulate at the gate of the field-effect transistor and contribute to the local potential. The pH value and other electrical properties or potentials of a sample can be determined directly from the behavior of the drain current and in particular the time constant $\tau_c$.

The pH value can thus be evaluated from measured values for the potential. The pH value is an electrical quantity of the sample. If the pH value is the only property of the sample that is of interest in the specific application, a direct calibration can also be carried out on the basis of test samples with a defined pH value, which assigns exactly one pH value to each time constant $\tau_c$ or each cut-off frequency $f_0$. On the basis of such a calibration, the pH value can be evaluated directly from $\tau_c$ or from $f_0$ without detour via a voltage or a potential.

The apparatus may be used to measure the time constant $\tau_c$ for capturing charge carriers or the time constant $\tau_e$ for emitting charge carriers by the bearing point.

The apparatus can only measure the signal of a bearing point, whose position is known. The current flow in the vicinity of the bearing point can be moved. The apparatus according to the invention therefore measures a signal with better resolution than apparatuses known from the prior art.

The current flow can be adjusted such that the scattering is caused only by the trapping point.

For this purpose, the current flow can be adjusted via a suitable voltage at the substrate in such a way that it only occurs in the tip of the nanowire. In the tip of the nanowire, the current flow takes place almost without scattering, i.e. a quasi-ballistic transport of the charge carriers occurs. The scattering of the charge carriers in the current flow is then mainly determined by the bearing point or trapping point. As a result, the current flow has less noise.

For improved suppression of scattering effects, the width of the intersection region of the nanowires can be selected particularly advantageously comparable to the scattering length of the charge carriers in the nanowires. This scattering length can lie e. g. at about 50 nm.

An advantageous use of the apparatus is characterized in that it is used for the diagnosis of cancer cells.

For cancer cell detection, antibodies can be arranged on the field-effect transistor according to the invention. The tissue or blood sample with the tumor cells of bowel cancer patients may be prepared as a cell solution, which can flow over the apparatus according to the invention. Advantageously, the antigens of the cancer cells can bind to the antibodies. This changes the surface potential at the gate of the apparatus according to the invention, which leads to a changed current strength in the nanowire transistor.

An advantageous use of the apparatus is characterized in that it is used in quantum information technology for storing information. The new cross-shaped geometry of the sensor can also be used for approaches to the use of quantum mechanical processes in information technology, for example, by evaluating the state of the trap when it has trapped a charge as "1" and the state of the trap without a trapped charge as "0". Thus, information can be stored by the apparatus.

An etchant comprising tetramethylammonium hydroxide (TMAH) or potassium hydroxide (KHO) may generally be used for etching.

During etching different anisotropic structures can be formed with TMAH. Any other etchant suitable for anisotropic etching may also be used. Flat planes can hereby be formed on the surfaces of the nanowires on a scale of about 0.5 nm to 5 nm.

The at least one bearing point can be generated by means of laser light.

Laser beams can be focused by the antennas in such a way that the beam only has a diameter of 10 nm to 70 nm. Thus, with the aid of laser light, bearing points can be generated at precisely defined positions or removed again as well, for example by an annealing process known from the prior art.

At least one nanowire can be doped. In particular, one nanowire can be provided with a different doping than the other nanowire.

Doping of the nanowires can preferably be achieved by an optionally different doping of the respective source and drain contacts. No further defects, for example in the nanowires, are generated when using this doping method. Alternatively, the semiconducting layer, from which the nanowires are etched, can be doped differently in different regions prior to the etching process.

Networks can also be provided, which have at least two intersection regions that are connected to one another by at least one nanowire. The first intersection region may have a different bearing point than the second intersection region, for example in the form of silicon-oxygen atoms or silicon-oxygen ions of different charge numbers. This enables the measured current signal to be modulated. For example, a current signal may be generated which changes from the maximum to the minimum value in a time interval, the amplitude of the signal likewise changing between two different values within this time interval.

The measurement results of the changes in potential caused by the accumulation of molecules depend, among other things, on the properties of the bearing point, such as the capture times, the activation energy, i.e. the voltage applied to the liquid necessary for the measurement, at which the charge exchange between the bearing point and the current flowing through the nanowire takes place, the cross-section of the respective nanowire, the position of the bearing point, the dependence of the current on characteristic times such as the capture and release times and also on the voltages at the gate and at the substrate. The respective optimal values can be determined by means known to those skilled in the art.

The characteristic parameters of the nanowire, such as its width and height, can be adjusted by means known to one skilled in the art in such a way that the measurement results are only determined by a single bearing point.

For passivation of the transistor according to the invention, for example, PI 4525 passivation material can be used, which can be completely removed with alkaline developers, for example on the bonding surfaces for external contacting of the means for applying voltage, before the structure is hardened in a so-called hard bake procedure. The passivation of the means for applying voltage concerns in particular a passivation of leads against liquids such as electrolyte solutions, which are to be investigated.

Subsequently, in an advantageous embodiment of the method according to the invention, a liquid-tight border is arranged on the active silicon layer which, for example, includes PI 4525 and can protect and insulate the contacts and leads. In addition, passivated means for applying a voltage to a liquid are provided within this border. These means can for example comprise an electrode, which can be immersed in a liquid to be examined and connected to a voltage source. This causes a "liquid gate" to be arranged.

A solution with biomolecules, for example troponin (Tn) that is known in the art, is then added and the transistor is brought into contact with or immersed in this solution.

The drain and gate are then subjected to voltages in an optimized regime in the I-V characteristic of the transistor. The current measured at the drain contact depends on the voltage applied in the liquid.

In a subsequent step, the time dependencies of the changes of the drain current are measured.

In a following step, the capture times of the charges at the bearing point are determined from the current measurement data. The capture times $\tau_c$ are measured for different pH values of the liquid sample. For this purpose, the concentration of the protons in the liquid can be changed by methods known to one skilled in the art. It is also possible to create a histogram which shows how often the current from source to drain assumes certain current values. This results in a statement about how fast the current changes. It can also be used to determine the capture time.

In a next step, the biological object is identified by analyzing the measured data and comparing it to calibration curves.

By applying a bias voltage to the substrate, that is to say a suitable back-gate voltage, a suitable bearing point can be selected in order to measure an amplified signal of the potential change by the accumulation of biomolecules.

An optimized voltage at the gate and local electric fields can be used to amplify and more accurately measure the effect of the current change. As a result, the dependence of the capture time on the current strength I can be changed from $I^{-1}$ to $I^{-15}$. The sensitivity can be improved by one order of magnitude as compared to biosensors known from the prior art. By measuring the changes in the current flow, which are caused by the changes in the potential in the gate region effected by the biomolecules, the biosensor, which comprises the field effect transistor, can then be made substantially more sensitive than previously known.

This structure can also be extended to a larger number of nanowires having a plurality of intersection regions and/or common sections. In this case, it is also possible to arrange several bearing points, e.g. one at each intersection region, which each have a specific capture time and emission time. The spectrum of the current signal can then contain several time constants.

If the width of the regions in which the nanowires are to be arranged is selected differently for each of the nanowires, the nanowires can have different heights after the etching process. The regions within the nanowires, in which the charge carriers move, can then also lie at different heights when the voltage on the substrate is switched on. Suitable voltages at the substrate and gate enable a switching of the current flow from three-dimensional to one-dimensional or zero-dimensional.

The method for producing the field-effect transistor for measuring small potentials illustrated here is compatible with CMOS technology.

Embodiments

In the following, embodiments of the invention will be explained in more detail with reference to examples and figures. These are not intended to be limiting. A method for producing a field effect transistor according to the invention having at least two intersecting nanowires and its use is indicated therein.

To this end, the following steps are carried out:

In a first step, a silicone on insulator wafer is oxidized, wherein a $SiO_2$ layer is produced on a silicon layer.

The $SiO_2$ layer can be produced by oxidizing the silicon substrate or the wafer. The oxidation is carried out at a temperature of about 1000° C. for a time period of 30 minutes. Thereafter, the Si layer has a thickness of about 50 nm. The thickness of the $SiO_2$ layer is about 5 to 40 nm. The {1 0 0} plane of the silicon crystal is advantageously oriented in the direction of the normal of the substrate in the direction of the layer structure. The substrate can comprise a silicon layer and an insulating layer disposed on the silicon layer. The active silicon layer can be arranged on this insulating layer.

On the $SiO_2$ layer, a lithographic process is then used in order to define the areas in which at least two intersecting nanowires are to be arranged, as well as areas for the respective source and drain contacts on the nanowires.

One possible geometry comprises two nanowires that are at an angle of about 90° to each other. For this purpose, a mask comprising a pattern for two such nanowires having at least two structures which are axisymmetric along their longitudinal axis and intersect at an angle of 90° and which each have at least one rectangular or square shape as a whole or in sections, see FIG. 8, can be advantageously oriented such that in one of the structures two sides of each rectangular section run parallel to the flat of a wafer. The flat of the wafer is known to be a straight edge on the side of the wafer, which serves to align the wafer and its crystal structure. Other geometries can also be defined, for example, two wider wires and three thinner wires having a common intersection region with six crossing points, see FIGS. 2 and 3.

Figure 11:
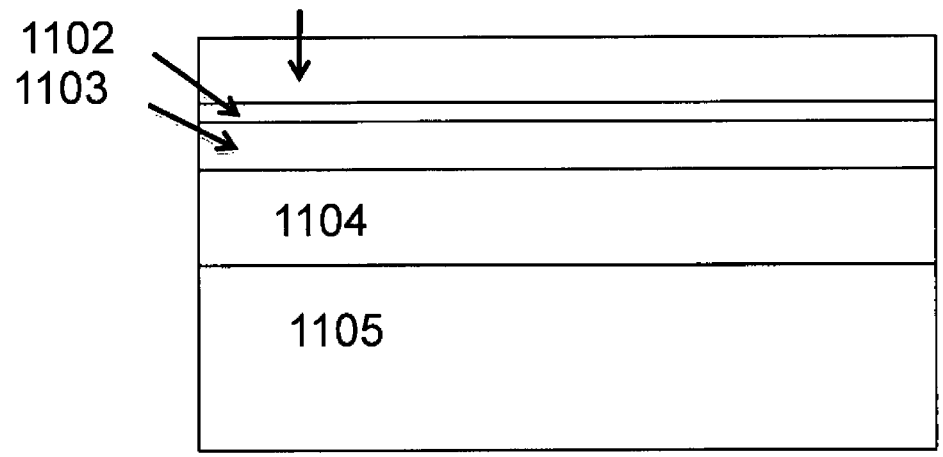
FIG. 11 illustrates a cross section through the layer sequence, from which the field effect transistor according to the invention is made.

On the active Si layer or on the $SiO_2$ layer, a photoresist or a resist for electron beams is arranged. The entire layer sequence is shown in FIG. 11.

After that, the mask is disposed between the coated substrate and the light or electron beam source. By a subsequent irradiation of the photoresist layer from this source, the pattern of the mask is transferred to the photoresist layer. This marks a surface area that matches the pattern of the mask. A surface area defined by the pattern of the mask is thus defined on the photoresist by the transfer.

In the lithographic process, photolithography using light beams can be used to structure the contacts, or electron beam lithography using electron beams can be used to structure the areas, in which the nanowires are to be arranged. Known methods of nano-imprint technology can also be used for structuring the contacts. When combining optical lithography and electron beam lithography, optical lithography can first be performed with the aid of a suitable photoresist, then the photoresist can be removed and electron beam lithography performed.

Subsequently, the areas of the photoresist layer outside a surface which corresponds to the pattern of the mask, i.e. the surface defined by the pattern of the mask, are removed using methods known from prior art, see FIG. 12.

The regions of the $SiO_2$ layer outside the area defined by the pattern of the mask are then removed by methods known from prior art. This can be done, for example, by known dry etching methods, such as material removal by bombardment with particles such as ions, e. g. with P, As or B. The photoresist is also removed, see FIG. 13.

Figure 14:
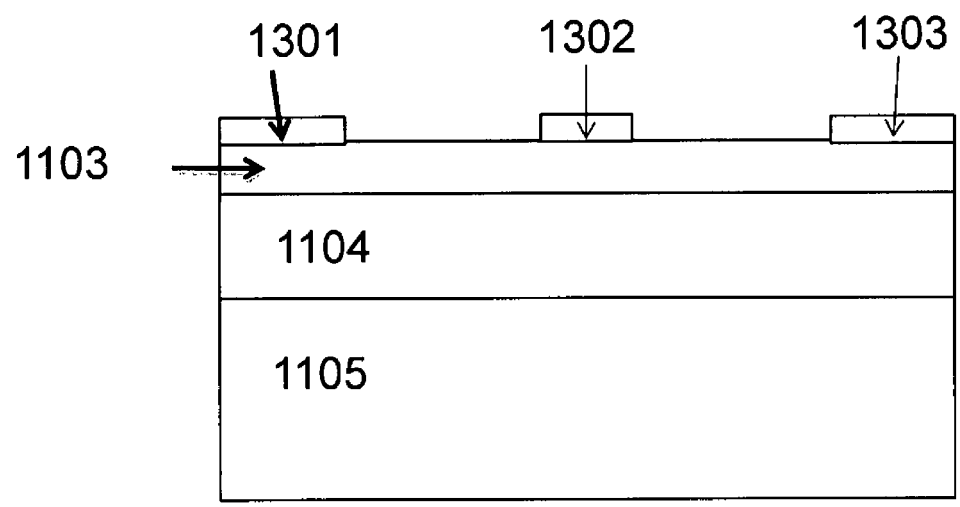
FIG. 14 illustrates a cross section through the layer sequence after removal of the remaining PMMA elevations.

In a next step, the active Si layer or its remaining areas, which are arranged within the surface corresponding to the pattern of the mask, are etched using an anisotropic wet-chemical method after removal of the remaining photoresist or electron beam resist, see FIG. 14. This process is performed for a sufficiently long period of time so as to form nanowires of triangular cross section intersecting at an angle of 90°, as well as elevations for source and drain contacts, see FIG. 15. The remaining areas of the $SiO_2$ layer can also be removed by methods known to those skilled in the art, see FIG. 16.

For etching, a mixture of 5% tetramethylammonium hydroxide (TMAH) and 95% distilled water at a temperature of 80° C. can be used. The silicon crystal is oriented with its <1 0 0> direction towards the normal of the surface of the substrate. The etching rate for the crystal planes in the (1 1 1) direction is 13 nm/min. When using TMAH, crystal planes oriented in the (1 1 1) direction are etched more slowly than, for example, the planes oriented in (1 0 0) direction. Nanowires with triangular cross section and almost flat crystal planes are formed at an angle of 54.7° for a period of 15 seconds to 10 minutes.

Figure 4:
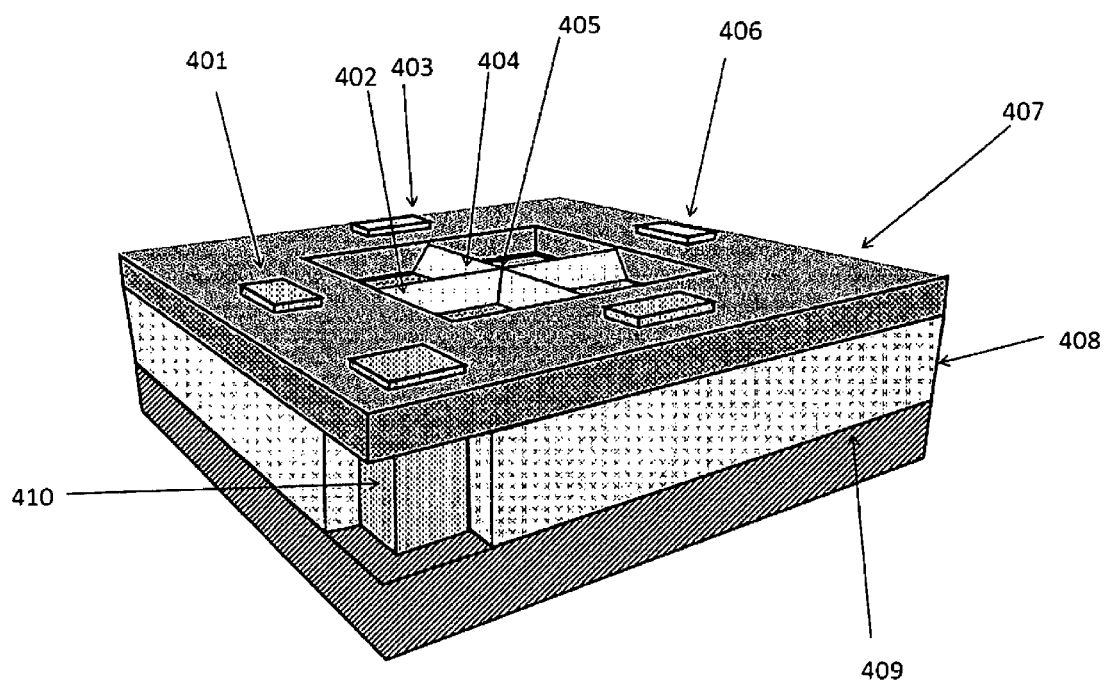
FIG. 4 illustrates a field effect transistor with two nanowires with a common intersection region.
Figure 5:
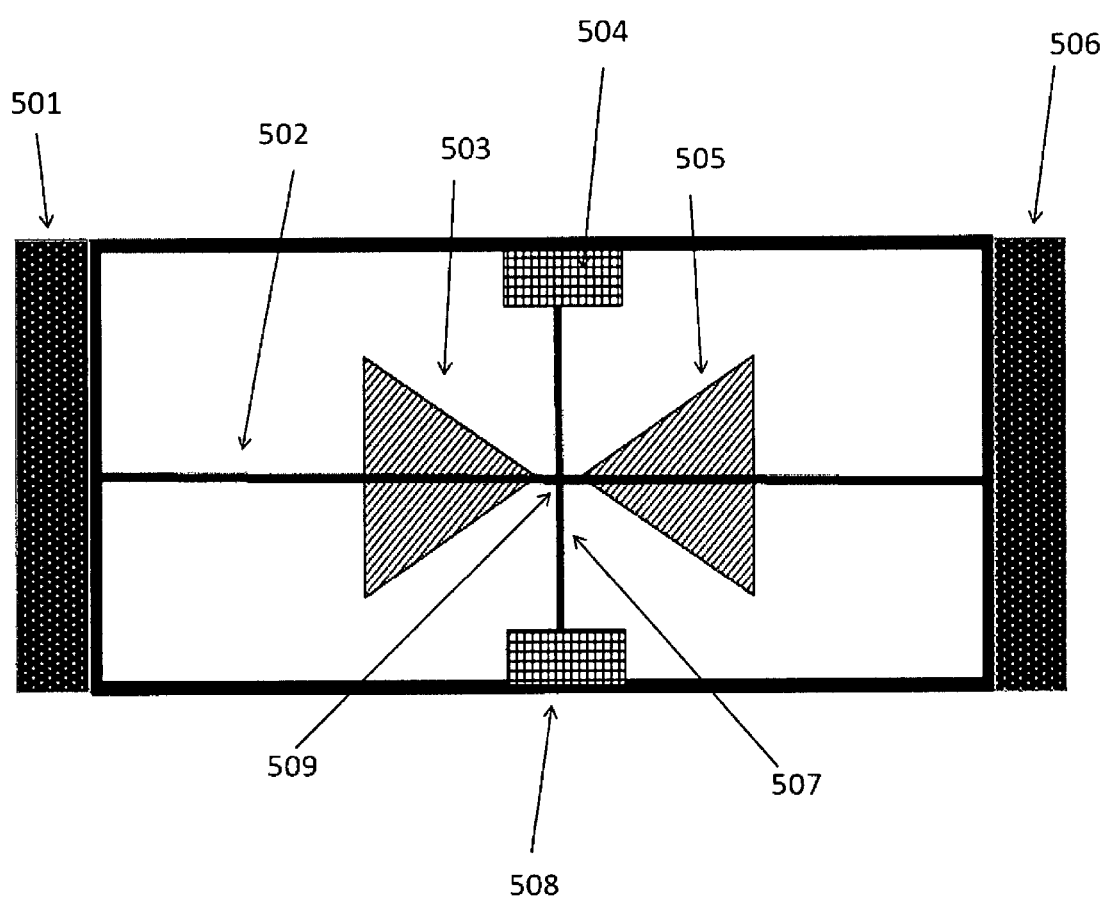
FIG. 5 illustrates a top view of two nanowires with a common intersection region.
Figure 6:
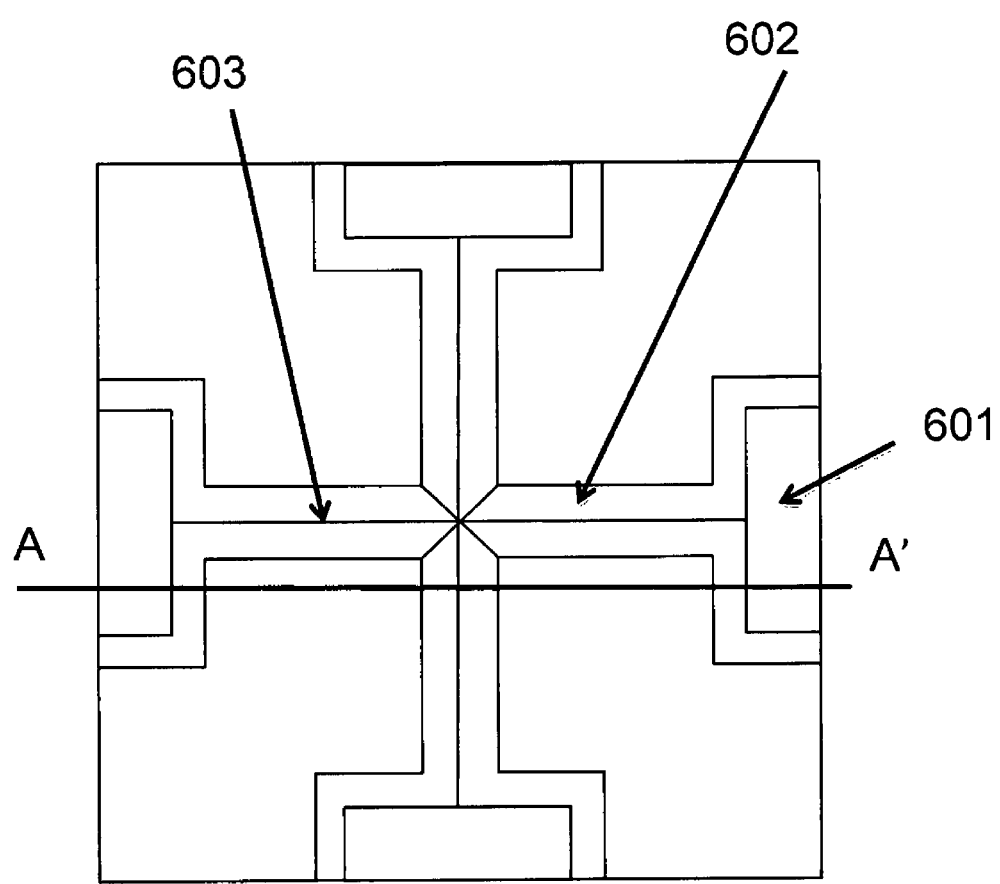
FIG. 6 illustrates a top view of the active silicon layer with etched nanowires.
Figure 24:
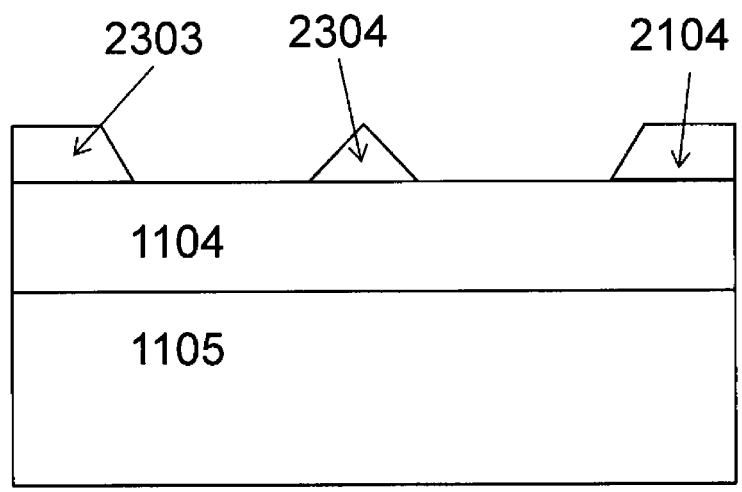
FIG. 24 illustrates a cross section through the layer sequence after removal of all regions of the PMMA layer and the upper silicon dioxide layer.

The transistor produced by the method according to the invention with at least two intersecting nanowires, see FIGS. 1, 5 and 6, is shown in FIG. 4 and in cross-section in FIG. 24.

Figure 9:
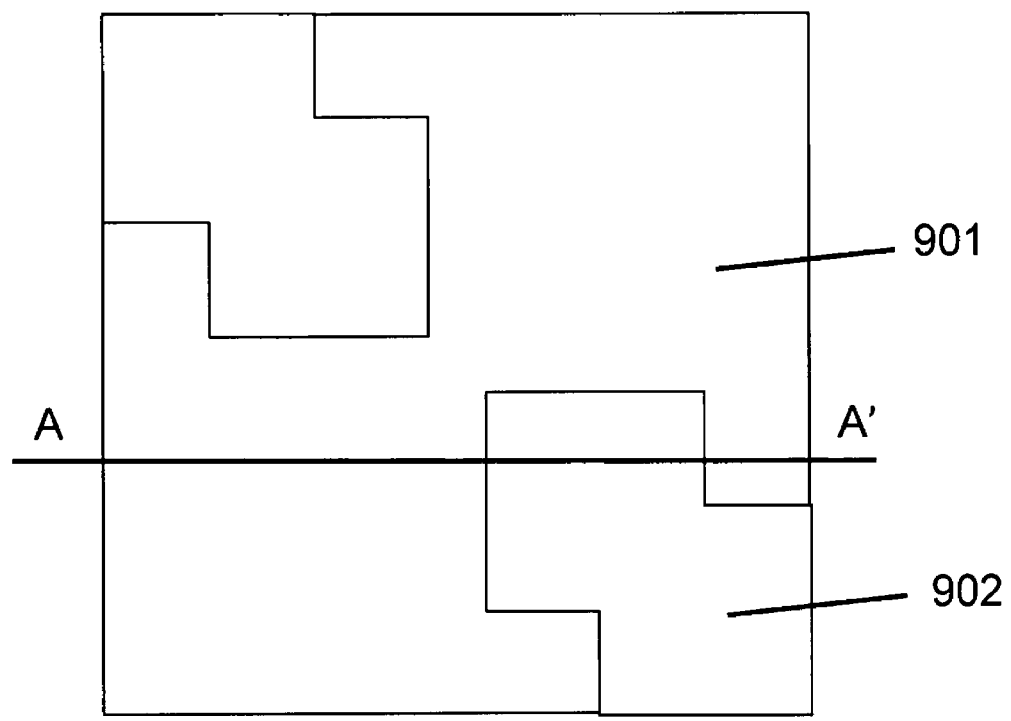
FIG. 9 illustrates a mask with partial surfaces of the pattern of the two diametrically opposed quadrants II and IV.

Alternatively, a first mask may be used for the irradiation, which mask comprises the total surface area of the pattern and two further surface areas which are arranged in diametrically opposed quadrants which are delimited by the two longitudinal axes of the total surface area of the pattern and together with the partial surface of the pattern form a square or rectangle in the respective quadrant, see FIG. 9.

When using such a mask, in two diametrically opposed quadrants, the edges of the area on the photoresist or the silicon dioxide layer, which corresponds to the surface of the pattern, are not irradiated. The non-irradiated regions of the photoresist and the silicon dioxide layer are then also not removed in a development step, see FIG. 20. Accordingly, the etchant then does not attack at these edges either. Therefore, the region into which the nanowires are to be etched is not attacked simultaneously at two opposite edges, see FIG. 21. The etching process can therefore be performed in a more controlled manner, than when the region is etched simultaneously from two sides.

Subsequently, a second mask of the same type can be used to irradiate the areas of the photoresist layer and/or silicon dioxide layer or other protective layers to be etched away in the quadrants that have not yet been irradiated when the first mask was used. These are the other two diametrically opposed quadrants, see FIG. 10. After removal of these regions, the remaining edges of the region, into which the nanowires are to be etched, are accessible to the etchant, which are opposite the edges from the previous irradiation and etching step. By arranging the etchant at these edges, the nanowires can then be etched into the semiconducting layer, see FIG. 23. The regions that were etched using the first mask can hereby be protected by arranging a photoresist or resist, see FIG. 22.

Alternatively, a mask can also be used which comprises the total surface of the pattern and three further surfaces, each of which is arranged in a quadrant delimited by the two longitudinal axes of the total surface area of the pattern and forms a square or rectangle together with the partial surface of the pattern in the respective quadrant.

When using such a mask, the edges of the area on the photoresist or silicon dioxide layer corresponding to the area of the pattern are irradiated at only one quadrant. The remaining edges are not attacked by the etchant when the etchant is applied. This allows even better control of the etching process. By using four masks of this type, all edges of the region in which the nanowires are to be arranged can be etched in successive etching steps.

Subsequently, a new $SiO_2$ layer is arranged by thermal oxidation along the surfaces of the nanowires as a dielectric layer with a thickness in the range of 5 nm to 40 nm, see FIG. 17.

In a next step, source, drain and gate are formed.

The elevations intended for the source and drain contact can be first doped advantageously with a doping concentration of $5 \cdot 10^{19}$ cm$^{-3}$ to $5 \cdot 10^{20}$ cm$^{-3}$.

Subsequently, metal platelets, for example gold platelets, are arranged at the elevations intended for source and drain contact, see FIG. 18. In addition, for example, a titanium layer can be arranged between the metal platelets and the elevations in order to avoid diffusion processes. The elevations can thus be connected to the respective nanowire and a voltage source in an electrically conductive manner. For example, at a corner or on the back side of the substrate, the active silicon layer can be removed and a metal block can be arranged as gate, and/or back gate, as well as electrically contacted with a voltage source, see FIG. 4 and FIG. 19, in which the metal block is shown in cross section along the line BB' shown in FIG. 7. The substrate can thus be contacted with means for applying a voltage in an electrically conductive manner.

In the $SiO_2$ layer or the dielectric layer on the nanowires, at least one bearing point is arranged at a distance of advantageously at most 2 nm from the surface of the nanowires.

To form the bearing points, metal platelets, for example the aforementioned gold platelets, can be evaporated onto the dielectric layer above the nanowires around the intersection region, with a thickness of e. g. 5 nm to 40 nm. These metal platelets form the components of an antenna, in particular a bowtie antenna. Laser beams can hereby be focused onto the center of the intersection region of the nanowires.

The metal platelets of the bowtie antennas typically have a distance of 50 nm, wherein the maximum width of the metal platelets is 60 nm. The structures of the metal platelets, in particular gold platelets, can be applied using electron beam lithography. In particular, four metal platelets can be arranged such that a platelet of metal is disposed on the dielectric layer on each nanowire on each side of the respective nanowire around the common intersection region of the nanowires, with opposing platelets each forming an antenna.

Through the antennas, incident electromagnetic radiation, in particular laser radiation, can be focused on a desired point and thus a bearing point can be generated at a specific location. This can be, for example, the center of the intersection region of the two nanowires. Bearing points can also be generated in a targeted manner at a plurality of locations. The accuracy is limited in particular by the diameter of the laser beam.

The density of the bearing points can be controlled by the light intensity of the laser at a wavelength of e. g. 785 nm, whereby the electric field in the dielectric layer is locally changed. In this way, bearing points or defects can be locally formed or removed, for example by an annealing process. The dielectric layer or $SiO_2$ layer on the nanowires is transparent to the laser radiation, which is advantageous. The bearing points can thus be produced precisely at the intermediate layer between the silicon layer and the $SiO_2$ layer of the nanowire, for example by removing oxygen atoms from the $SiO_2$ layer.

Figure 18:
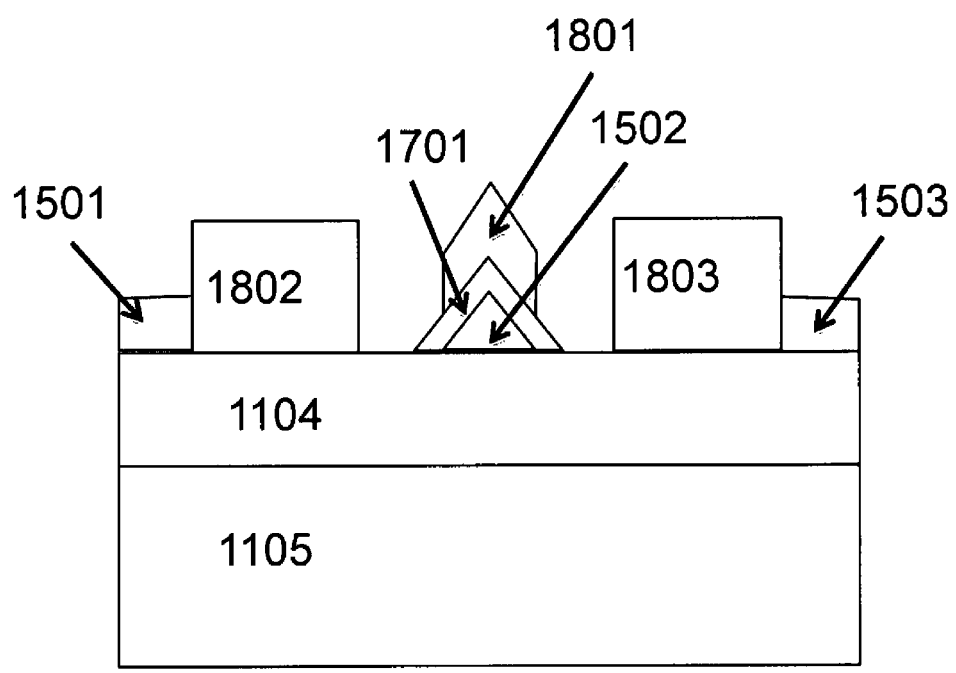
FIG. 18 illustrates a cross section through the layer sequence after arrangement of gold platelets on the nanowires.

Then the means for applying voltage to the drain, source and gate contacts and the surfaces of the nanowires on which no $SiO_2$ layer is arranged are passivated, see FIG. 18.

For this, e. g. PI 4525 passivation material can be used, which can be completely removed with alkaline developers, for example on the bonding surfaces for external contacting of the means for applying voltage, before the structure is hardened in a so-called hard bake procedure. The passivation of the means for applying voltage concerns in particular a passivation of leads against liquids such as electrolyte solutions, which are to be investigated.

Subsequently, a liquid-tight border is arranged on the active silicon layer which, for example, includes PI 4525 and can protect and insulate the contacts and leads. In addition, passivated means for applying a voltage to a liquid are provided within this border. These means can for example comprise an electrode, which can be immersed in a liquid to be examined and connected to a voltage source. This causes a "liquid gate" to be arranged.

In a further step, a solution containing biomolecules, for example, carbon-reactive proteins (CRP) or troponin (Tn) known from the prior art, is added.

In a further step, the drain and gate are then subjected to voltages in an optimized regime in the I-V characteristic of the transistor. The current measured at the drain contact depends on the voltage applied in the liquid.

In a subsequent step, the time dependencies of the changes of the drain current are measured.

In a following step, the capture times of the charges at the bearing point are determined from the current measurement data. The capture times $\tau_c$ are measured for different pH values of the liquid sample. For this purpose, the concentration of the protons in the liquid can be changed by methods known to one skilled in the art. It is also possible to create a histogram which shows how often the current from source to drain assumes certain current values. This results in a statement about how fast the current changes. It can also be used to determine the capture time.

In a next step, the biological object is identified by analyzing the measured data and comparing it to calibration curves.

By applying a bias voltage to the substrate, that is to say a suitable back-gate voltage, a suitable bearing point can be selected in order to measure an amplified signal of the potential change by the accumulation of biomolecules.

An optimized voltage at the gate and local electric fields can be used to amplify and more accurately measure the effect of the current change. As a result, the dependence of the capture time on the current strength I can be changed from $I^{-1}$ to $I^{-15}$. The sensitivity can be improved by one order of magnitude as compared to biosensors known from the prior art. By measuring the changes in the current flow, which are caused by the changes in the potential in the gate region effected by the biomolecules, the biosensor, which comprises the field effect transistor, can then be made substantially more sensitive than previously known.

This structure can also be extended to a larger number of nanowires having a plurality of intersection regions and/or common sections.

If the width of the regions in which the nanowires are to be arranged is selected differently for each of the nanowires, the nanowires can have different heights after the etching process. The regions within the nanowires, in which the charge carriers move, can then also lie at different heights when the voltage on the substrate is switched on. Suitable voltages at the substrate and gate enable a switching of the current flow from three-dimensional to one-dimensional or zero-dimensional.

The method for producing the field-effect transistor for measuring small potentials illustrated here is compatible with CMOS technology.

FIG. 1 shows the active region of the field effect transistor with two intersecting nanowires. FIG. 1 *a*) shows a side view. Here, the case is illustrated, where two nanowires 101, 102, having a triangular cross section, intersect at an angle of 90°. The characteristic width of the triangular cross section, referred to as $L_{side}$, i.e. the width of the wire on the side facing the substrate, is 50 nm. For example, the length of nanowire $L_{NW}$ assumes values of 200 nm, 400 nm, 600 nm, 1000 nm, or a value therebetween.

FIG. 1 *b*) shows the top view of the two nanowires 101, 102, which intersect at an angle of 90° in an intersection region with the center 103. The substrate of the silicon-on-insulator can be supplied with a bias voltage, the so-called back gate voltage. This shifts the conductive area of the nanowire, in which charge flow takes place, to the tip, i.e. the area facing away from the substrate, of the triangular structure shown.

Figure 2:
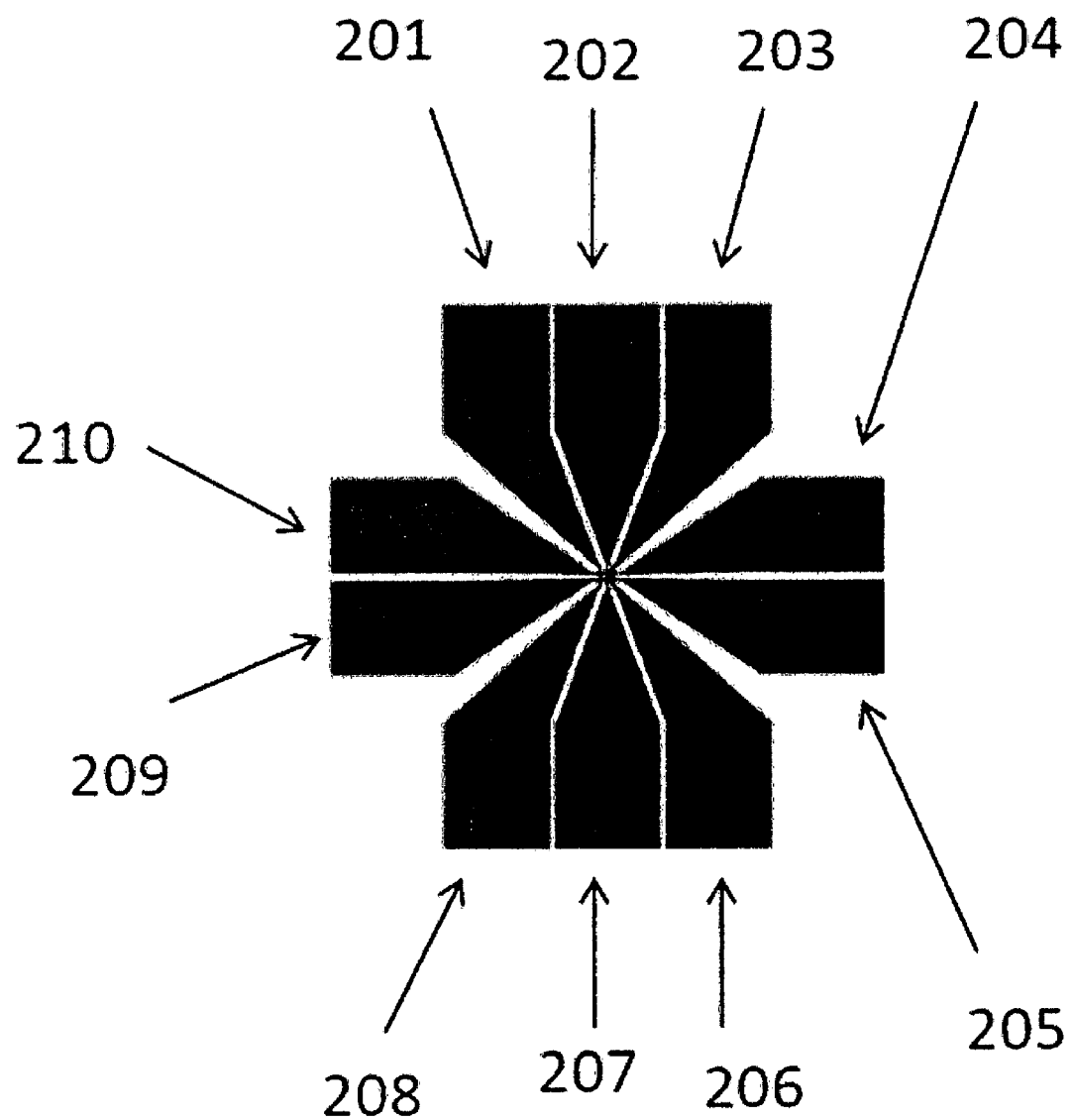
FIGS. 2 *a*) and *b*) illustrate an example of a mesa structure with five nanowires with common intersection regions.
Figure 2:
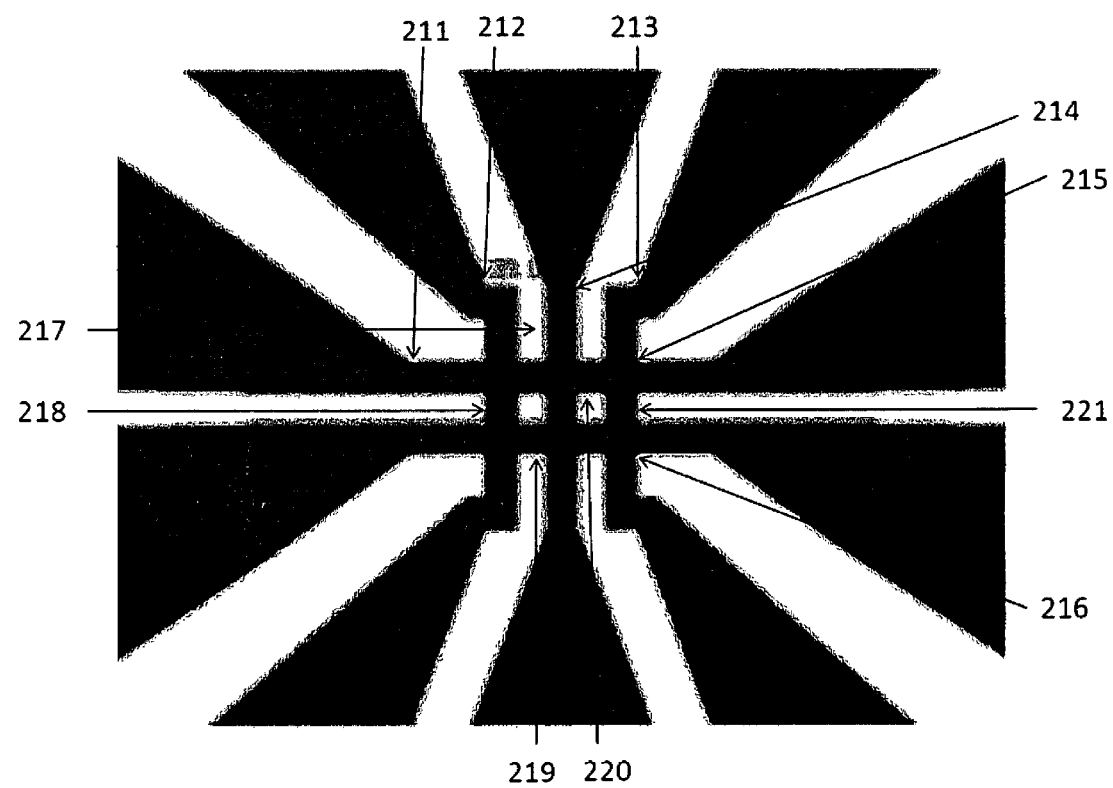

FIG. 2 *a*) shows the mesa structure in the case of several nanowires. FIG. 2 *b*) shows the enlarged center region of the mesa structure from FIG. 2 *a*) with the nanowires intersecting at an angle of 90° with two times three contact points. The structure of two nanowires in the horizontal 219, 220 and three nanowires in the vertical, designated with 217, 218, 221, is shown in the new mask.

Each nanowire is connected to a corresponding lead 201, 202, 203, 204, 205, 206, 207, 208, 209, 210 shown in FIG. 2 *a*). These leads have dimensions on the scale of micrometers. This allows the resolution typically available in optical lithography to be used. The lithography can be carried out in one step or in a plurality of partial steps.

The black colored surface corresponds to the surface area of silicon. There are ten electrical contacts between the leads and the respective nanowires, of which four are marked with 211, 212, 213, 214 in FIG. 2 *b*). Of the two times three contact points, at which the nanowires intersect, two are marked 215 and 216.

Figure 3:
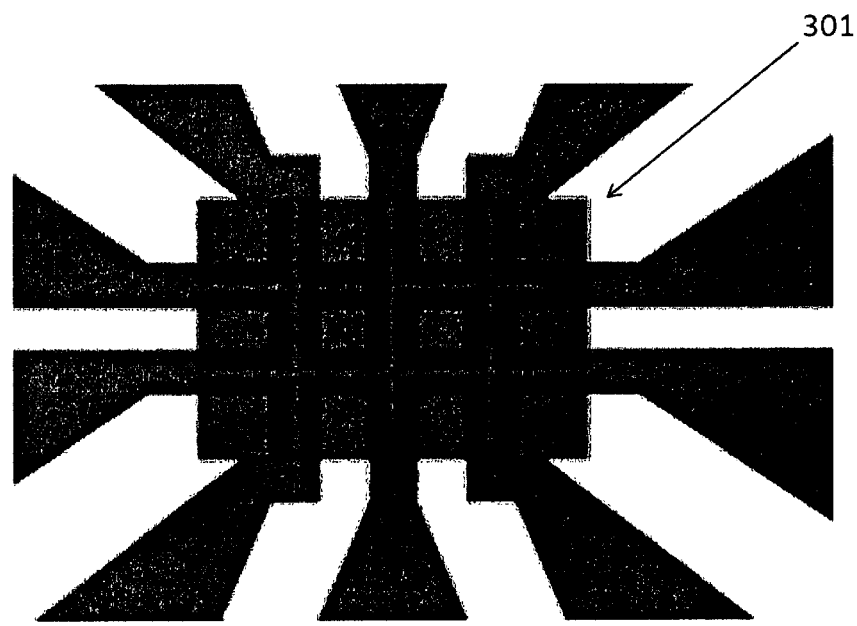
FIG. 3 illustrates a mask for producing nanowires with a common intersection region.

FIG. 3 shows the mask, which has been developed to produce the field effect transistor with a structure of five intersecting nanowires arranged with the same height and at the same level. The figure shows an example of two or three nanowires, respectively, which intersect at 90°. Also shown are the respective leads. The square 301 comprises the surface area in which electron beams are used for structuring.

FIG. 4 shows a field effect transistor comprising nanowires 402 and 404 on a $SiO_2$ layer 408, which intersect at an angle of 90° in the intersection region 405. Source and drain contacts are arranged at the ends of the nanowires, for example 406 and 403. Source and drain each comprise an upper contact surface made of a metal, marked with 401. The contacts are protected by a passivation layer, marked with 407. This passivation layer also forms a liquid-tight border. Also shown is a large metal contact 410 on the front side of the structure to apply a voltage, or back gate voltage, to substrate 409.

FIG. 5 shows the top view of two nanowires 502 and 507 that intersect at an angle of 90°, and the rectangular metal contacts 501, 504, 506, 508 on the wires and the intersection region 509 of the nanowires. The current flow in the intersection region can be shifted into the tip of the nanowires by applying a voltage to the substrate. A bearing point suitable for examining a sample can also be selected by applying a voltage to the substrate. Also shown is a bowtie antenna having two triangular metal platelets 503 and 505 arranged close to the intersection of the nanowires. The antenna can be used to adjust the density of the traps or bearing points and to control the selection and/or position of a single bearing point. By applying a voltage to the substrate, the suitable bearing point or trap can be selected, in order to obtain the amplified signal from the change in surface potential in the region of the intersecting nanowires. The change in the surface potential results from the binding or accumulation of molecules to the dielectric layer of the gate.

FIG. 6 shows a top view of the active silicon layer, with the nanowires etched into this layer, one of which is referred to here by way of example as 602 with a triangular cross section, the tip of the triangular cross section along the wire being denoted here as 603 and elevations for the electrical contacts, one of which is designated here by way of example by 601.

Figure 7:
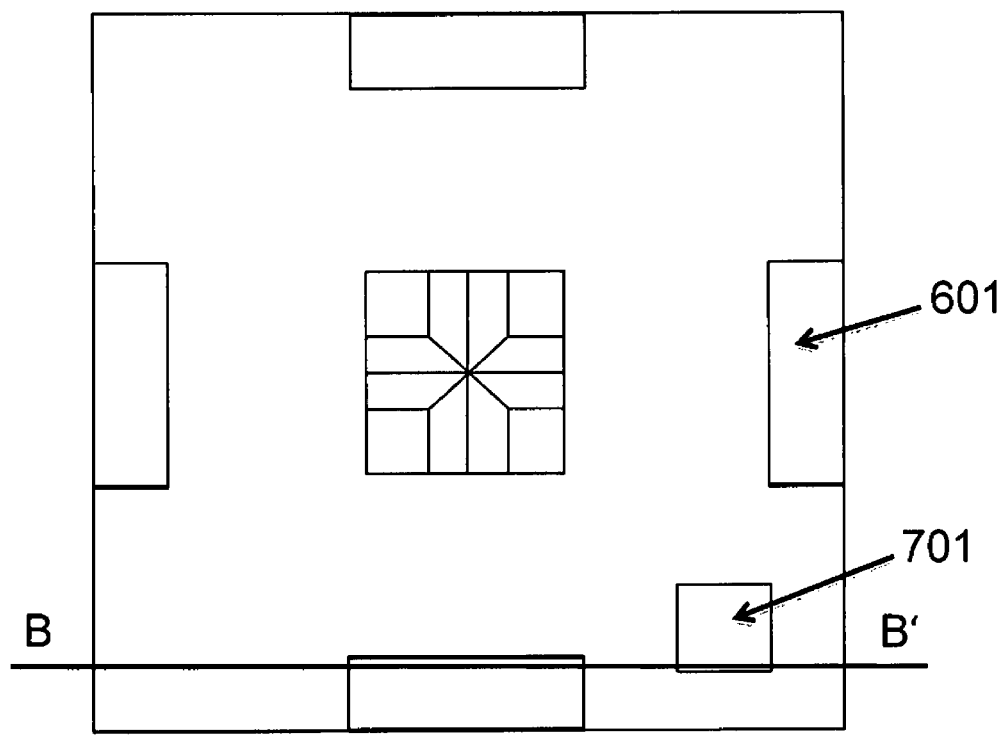
FIG. 7 illustrates a top view of the field effect transistor without a border with a cuboid metal contact arranged in the active silicon layer.

FIG. 7 shows a top view of the field effect transistor without border with the nanowires and, arranged in the active silicon layer, a cuboid metal contact 701 for contacting the substrate.

Figure 8:
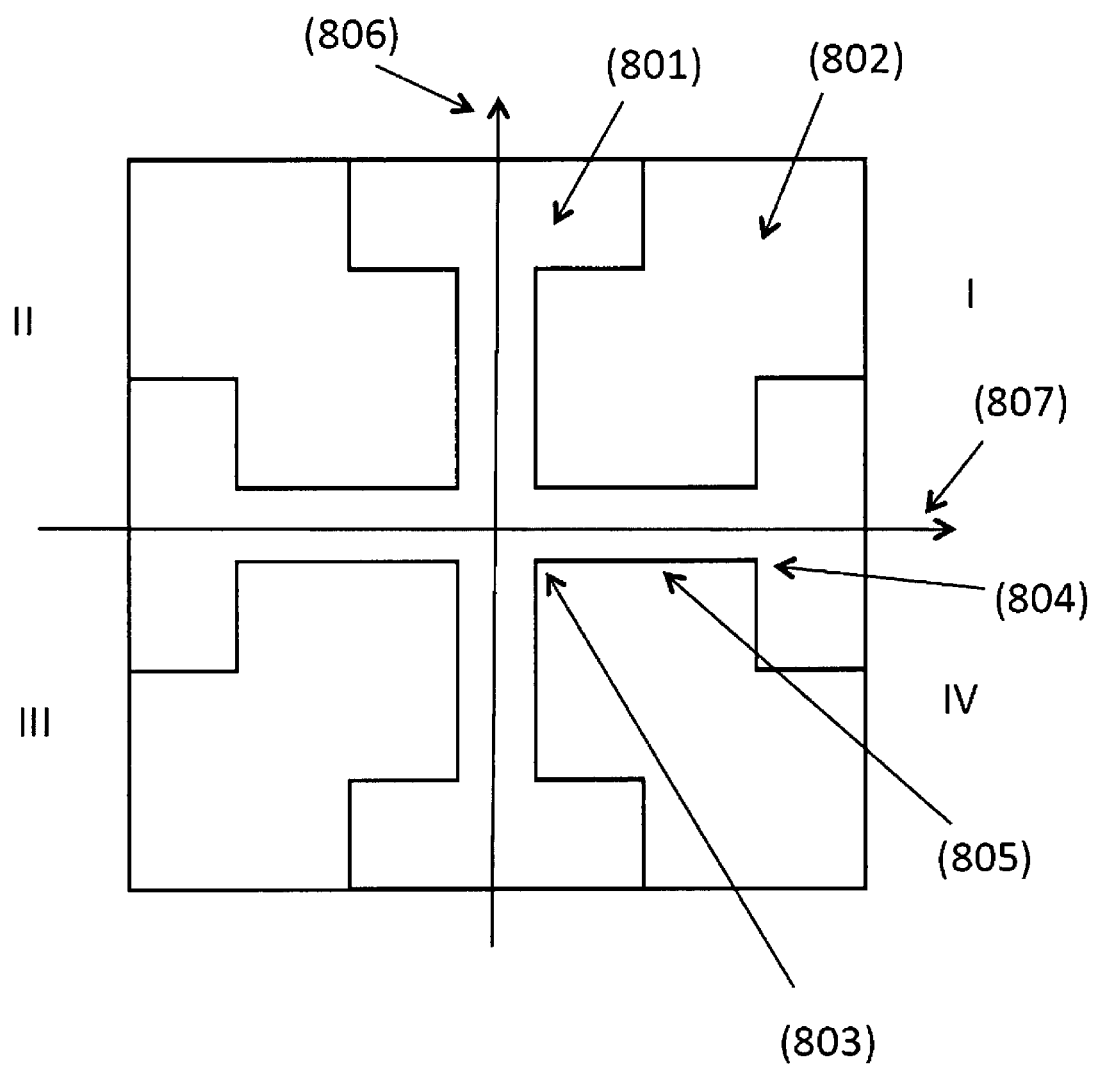
FIG. 8 illustrates a surface of the pattern with explanation of the geometric definitions.

FIG. 8 shows the surface area of the pattern for arranging nanowires with quadrants I, II, III, IV delimited by the longitudinal and/or symmetry axes 806, 807 of the surface of the pattern 801. Furthermore, the surfaces complementary to the surface of the pattern in the quadrants, which complement the surface area of the pattern in the respective quadrants to form a square, are shown. By way of example, one of these complementary surfaces is designated 802. Furthermore, an edge 805 is shown by way of example as a section between the corner points 803 and 804 of the surface area of the pattern.

FIG. 9 shows a mask in which the partial surface areas of the pattern in the two diametrically opposed quadrants I and III are supplemented by further surfaces, each to form a square. In quadrants II and IV, the partial surfaces of the pattern are not supplemented to form a square. Radiation can thus pass along the edges in these quadrants, for example through the surface 902.

Figure 10:
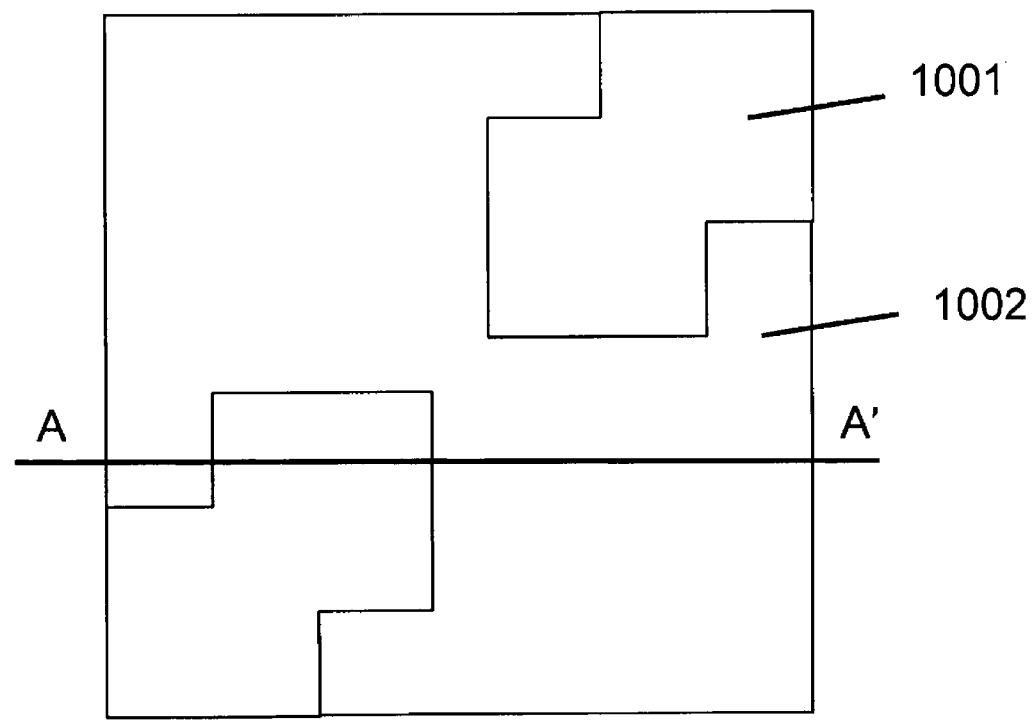
FIG. 10 illustrates a mask with partial surfaces of the pattern of the two diametrically opposed quadrants I and III.

FIG. 10 shows the mask that is complementary to the mask in FIG. 9. In this mask, the partial surface areas of the pattern in the two diametrically opposite quadrants II and IV are each supplemented by further surfaces to form a square. In quadrants I and III, the partial surfaces of the pattern are not supplemented to form a square. Radiation can thus pass along the edges in these quadrants, for example through the surface 1002.

FIG. 11 shows a cross section through the substrate comprising, for example, a PMMA layer 1101, a silicon dioxide layer 1102, an active silicon layer 1103, the {1 0 0} plane of which is oriented towards the normal of the surface of the substrate in the direction of the layer sequence, a further silicon dioxide layer 1104, a silicon layer 1105.

Figure 12:
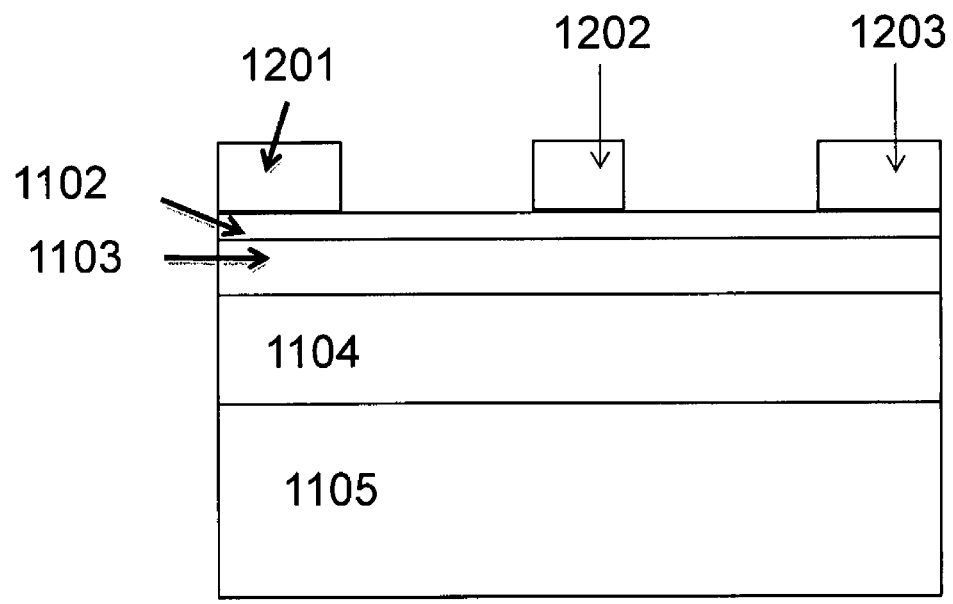
FIG. 12 illustrates a cross section through the layer sequence after removal of selected regions of the PMMA layer.

FIG. 12 shows the layer sequence after selected areas of the PMMA layer were irradiated with electron beams using a mask according to FIG. 8 and removed by a development step known to one skilled in the art. PMMA elevations 1201, 1202, 1203 remain on the silicon dioxide layer 1102.

Figure 13:
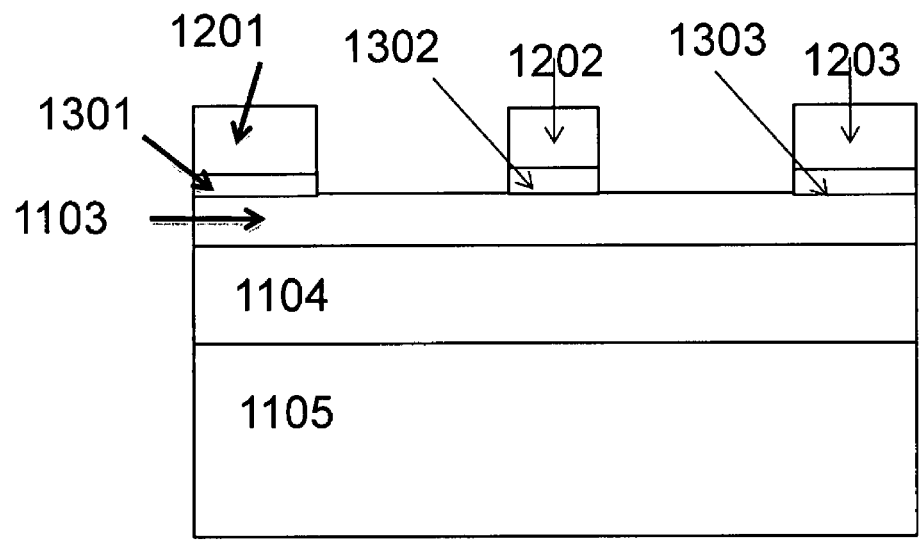
FIG. 13 illustrates a cross section through the layer sequence after removal of selected regions of the upper silicon dioxide layer.

FIG. 13 shows a layer sequence after resistive ion etching (RIE) was used to remove the areas of the silicon dioxide layer 1102 between PMMA areas 1201, 1202, 1203. The areas 1301, 1302, 1303 of the silicon dioxide layer remain.

FIG. 14 shows the layer sequence, after the remaining PMMA elevations 1201, 1202, 1203 on the silicon dioxide layer were removed using methods known to those skilled in the art.

Figure 15:
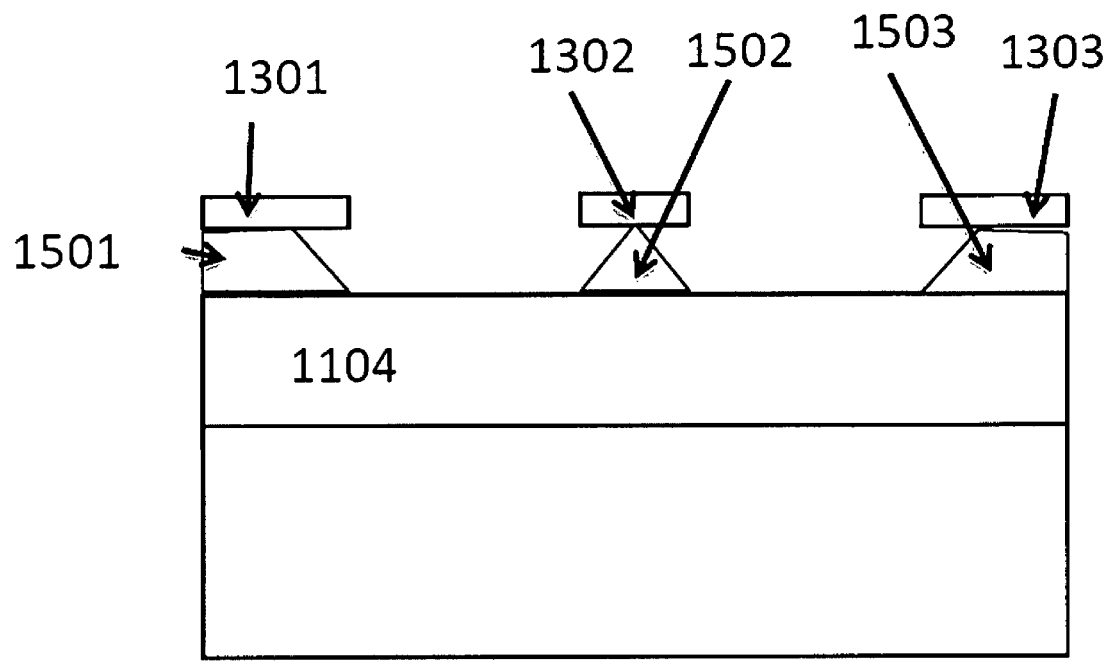
FIG. 15 illustrates a cross section through the layer sequence after arrangement of the desired anisotropic structures in the active silicon layer.

FIG. 15 shows the layer sequence after the desired anisotropic structures 1501, 1502, 1503 have been etched in the active silicon layer underneath the remaining areas of the silicon dioxide layer 1301, 1302, 1303.

Figure 16:
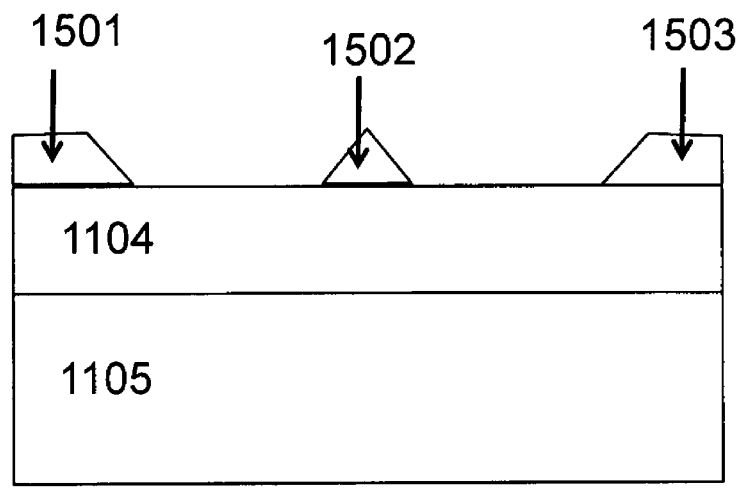
FIG. 16 illustrates a cross section through the layer sequence after removal of all regions of the upper silicon layer.

FIG. 16 shows the layer sequence after the areas of the silicon dioxide layer 1301, 1302, 1303 have been removed by methods known to those skilled in the art. The desired geometry remains with nanowire 1502 having a triangular cross section.

Figure 17:
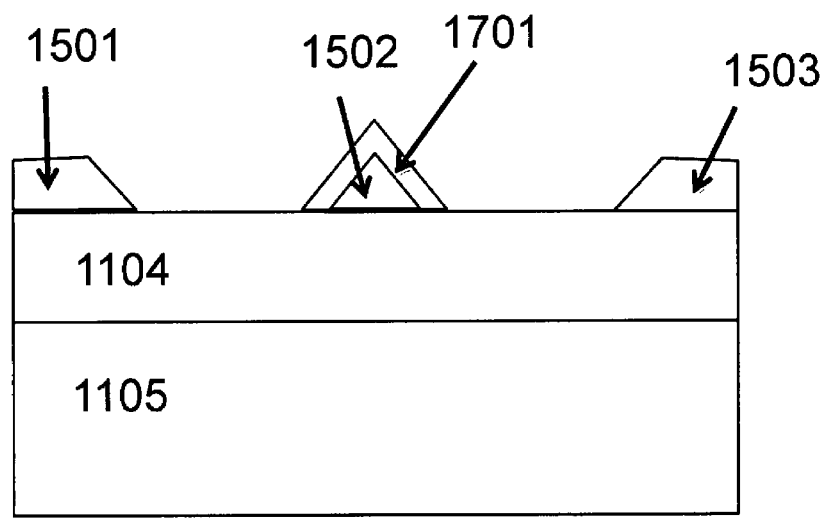
FIG. 17 illustrates a cross section through the layer sequence after arrangement of a new silicon dioxide layer along the surface of the nanowires.

FIG. 17 shows the layer sequence, after a new silicon dioxide layer 1701 has been placed on the nanowire 1502 by thermal oxidation along the surface of the nanowire.

FIG. 18 shows the layer sequence, after a gold platelet 1801, as a component of the antenna, has been placed on the silicon dioxide layer 1701 that is on the nanowire 1502 with the triangular cross section. Moreover, passivation elements 1802 and 1803 have been arranged on the elevations 1501 and 1503.

Figure 19:
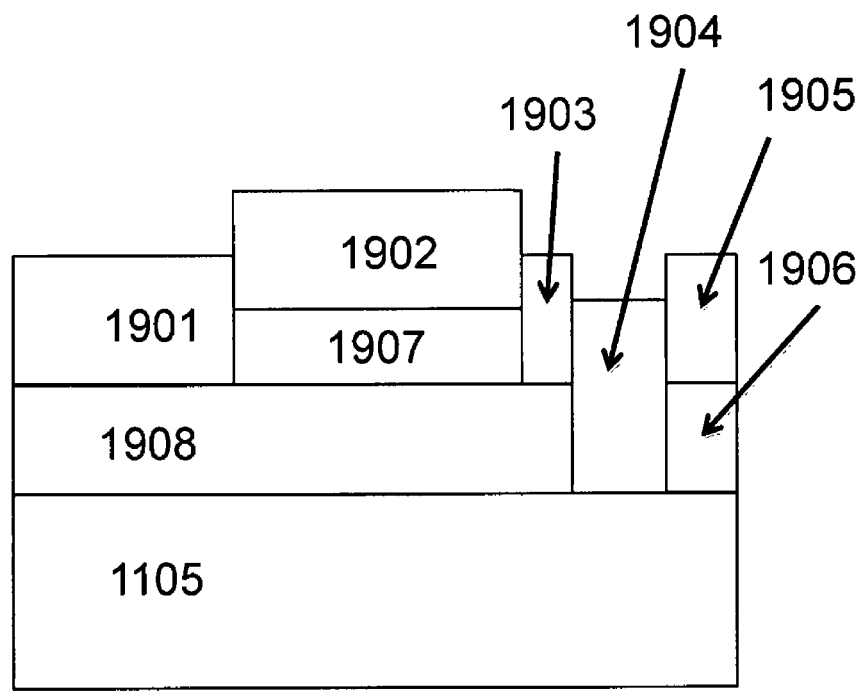
FIG. 19 illustrates a cross section through the layer sequence after arrangement of a cuboid metal contact.

FIG. 19 shows the layer sequence along the line BB' drawn in FIG. 7, after a cuboid metal contact 1904 was arranged in the active silicon layer, which metal contact is in contact with the lowest silicon layer 1105 for applying a back gate voltage. In the illustrated cross section, the silicon dioxide layer on the lowest silicon layer is divided into two areas 1906 and 1908. On the elevation 1907 arranged as a contact on the silicon dioxide layer, which elevation comprises silicon and is arranged in the active silicon layer, a cuboid elevation 1902 comprising metal is arranged for electrical contact with the external measuring assembly. Element 1901 comprises passivating material.

Figure 20:
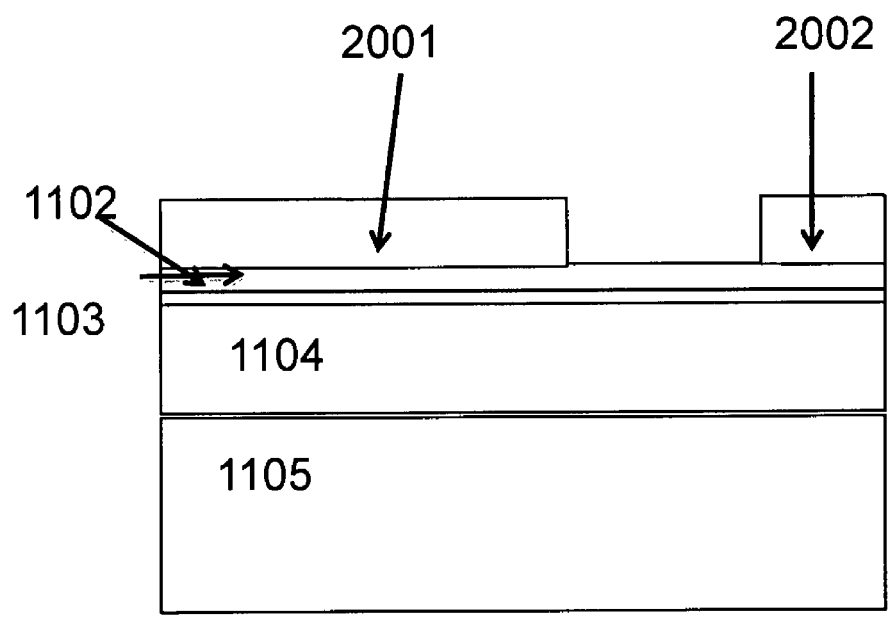
FIG. 20 illustrates a cross section through the layer sequence after removal of a suitable region of the PMMA layer.

FIG. 20 shows the layer sequence along the line AN shown in FIG. 6 after a suitable area of the PMMA layer was first irradiated with the mask shown in FIG. 9 and then removed. The two partial areas 2001 and 2002 remain in cross section from the PMMA layer.

Figure 21:
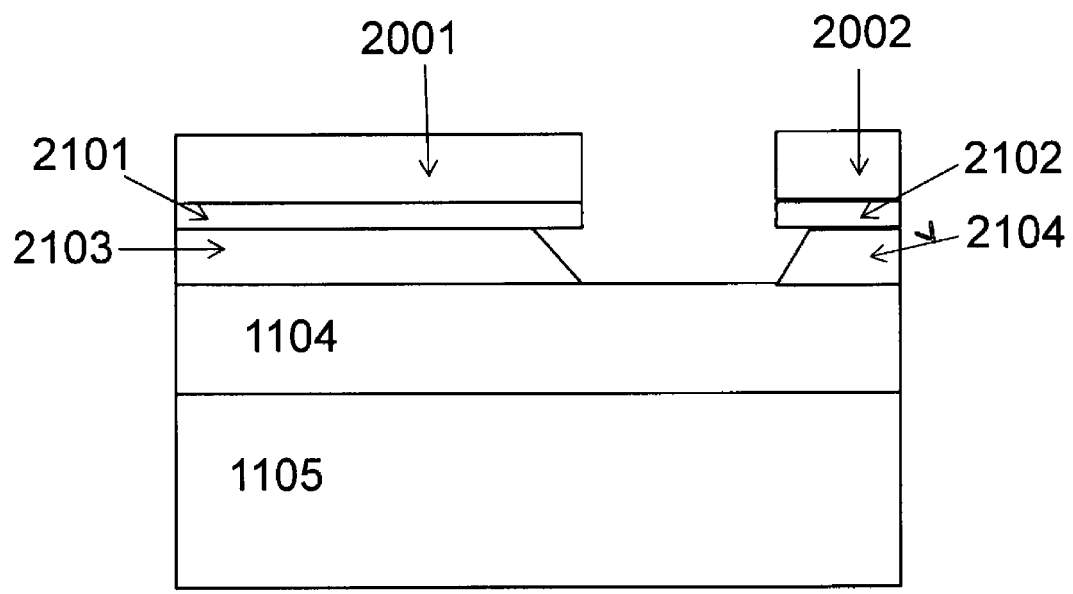
FIG. 21 illustrates a cross section through the layer sequence after etching selected regions in the silicon dioxide layer, which are defined by the mask shown in FIG. 9.

FIG. 21 shows the layer sequence after the areas of the silicon dioxide layer 1102 below the areas 2001 and 2002 remaining in the PMMA layer have been removed, so that two partial areas 2101 and 2102 remain in this layer and the areas of the active silicon layer 2103 and 2104 were anisotropically etched underneath these remaining areas 2101 and 2102.

Figure 22:
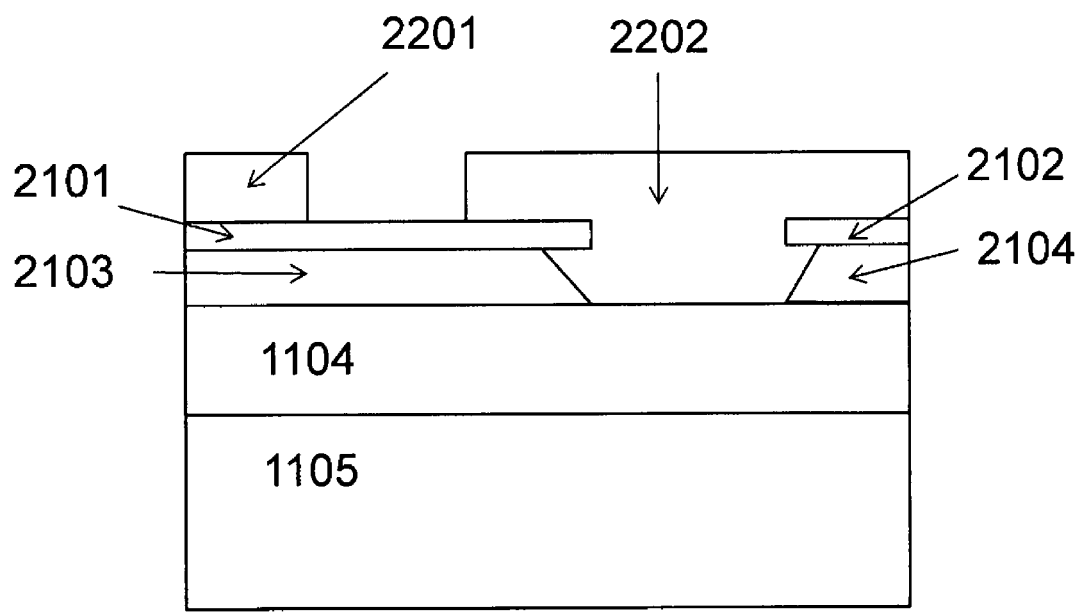
FIG. 22 illustrates a cross section through the layer sequence after etching selected regions in the silicon dioxide layer, which are defined by the mask shown in FIG. 10.

FIG. 22 shows the layer sequence shown in FIG. 21 after the etched area was protected by the arrangement of new PMMA and a suitable area of the PMMA layer was first irradiated with the mask shown in FIG. 10 and then removed. The two partial areas 2201 and 2202 remain in cross section from the PMMA layer.

Figure 23:
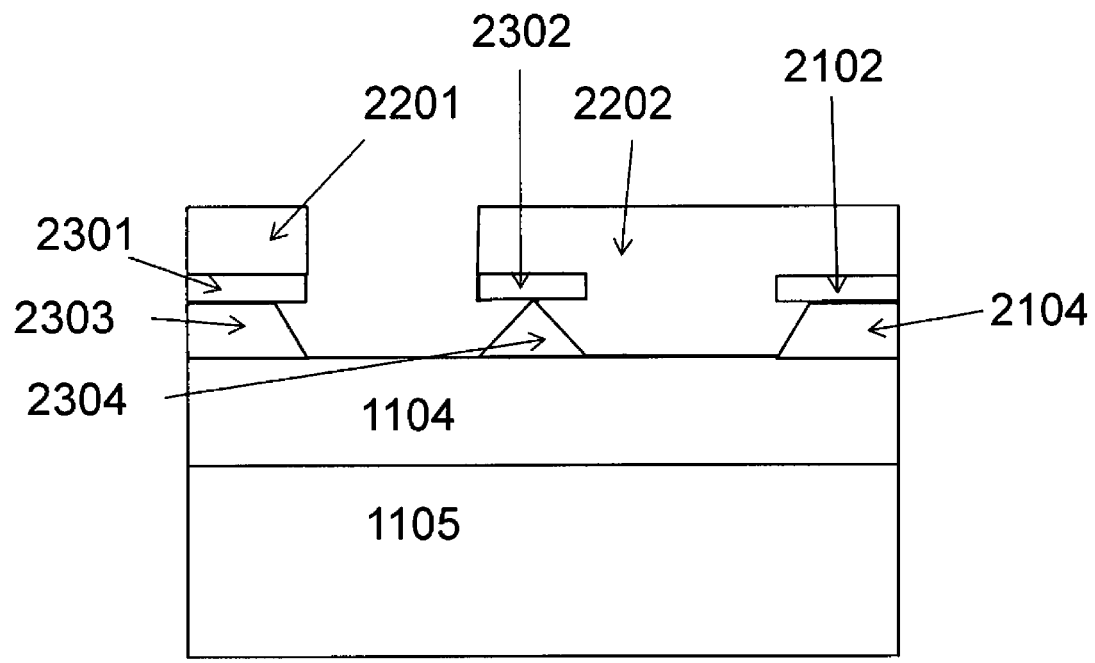
FIG. 23 illustrates a cross section through the layer sequence after removal of selected regions of the upper silicon dioxide layer.

FIG. 23 shows the above layer sequence after the areas of the silicon dioxide layer 2101 underneath the areas 2201 and 2202 that remain in the PMMA layer were removed, so that two partial areas 2301 and 2302 remain in this layer and the area of the active silicon layer 2103 between these areas 2301 and 2302 was anisotropically etched, so that the partial areas 2303 and 2304 remain. Here, the partial area 2304 forms the nanowire having a triangular cross section.

FIG. 24 shows the layer sequence after the areas of the PMMA layer 2201, 2202 and the silicon dioxide layer 2301, 2302, 2102 have been removed by methods known to those skilled in the art. The desired geometry with a nanowire 2304 having a triangular cross section remains.

Figure 25:
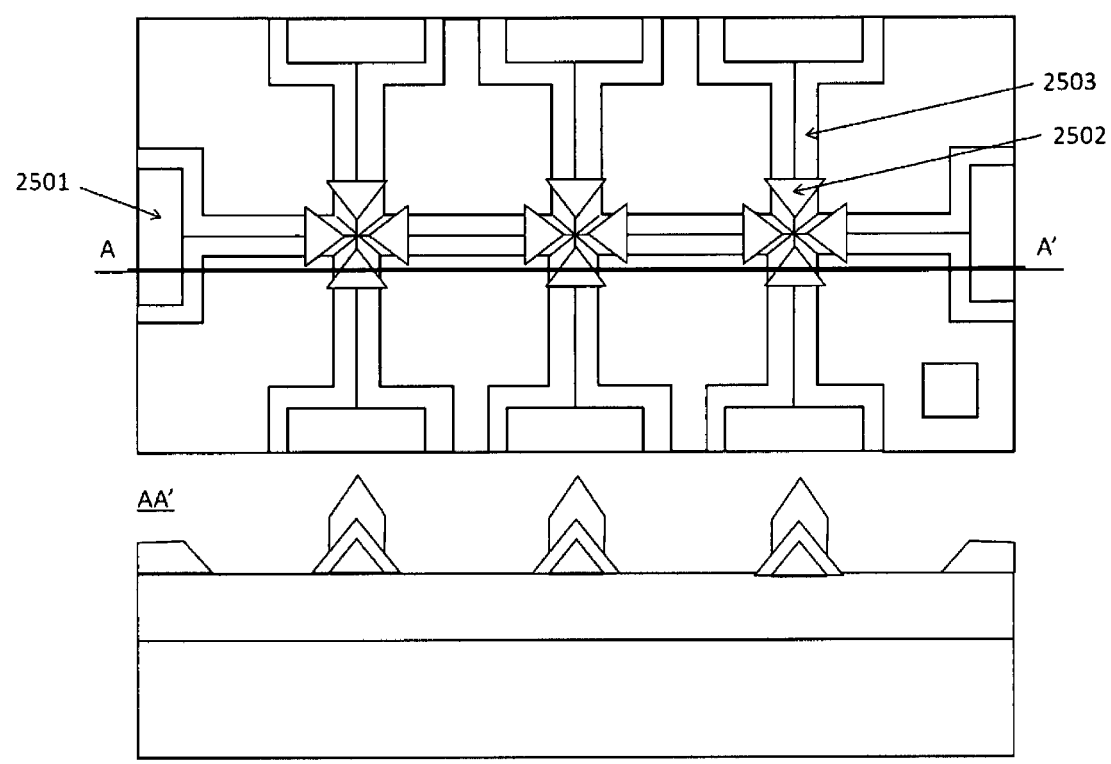
FIG. 25 illustrates a network comprising a plurality of intersection regions connected by nanowires.

FIG. 25 shows a network of several intersection regions connected by nanowires. Of the connecting nanowires, one is designated by way of example as 2503, and of the intersection regions, one is designated by way of example as 2502. Of the contacts, one is designated by way of example as 2501. Such a network can be used, for example, in information technology or quantum information technology for logical gates, if, through the behavior of the drain currents, the capturing or the emission of charge carriers such as electrons by the impurities is measured.

The following applies to the embodiments:

Although in the simplest version of the invention two intersecting nanowires of a semiconducting material each with a source and drain contact and with means for applying a voltage between the respective source and drain contact are spoken of, it has been found in the context of the invention that it can be advantageous if the two intersecting nanowires each have only two contacts. These can, but need not necessarily, be designed as source and drain contacts.

It has been found that when using the apparatus according to the invention and the apparatus as such, it can also be advantageous that a voltage is not applied between the two contacts of a single nanowire, as would be the case in the case of a source and drain contact for a nanowire, but if a voltage can also be applied between any contact of the first nanowire and any further contact of the second nanowire. Then intersecting nanowires are understood to have at least one common contact point, for which purpose the nanowires should preferably lie in one plane.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An apparatus for measuring electrical potentials of a liquid sample, the apparatus comprising:
   a substrate;
   a substrate contact arranged on the substrate and configured to apply a bias voltage to the substrate;
   two intersecting nanowires of semiconductive material arranged on the substrate and configured to form an active region of a field effect transistor, each of the two intersecting nanowires being connected to a source contact and a drain contact;
   a dielectric layer extending along surfaces of the two intersecting nanowires, the dielectric layer configured to electrically insulate the two intersecting nanowires from the liquid sample, the dielectric layer having a layer thickness between 5 and 40 nm; and
   at least one capture point including at least one impurity arranged in the dielectric layer, the at least one capture point configured to capture charge carriers from at least one of the two intersecting nanowires and/or to provide charge carriers to at least one of the two intersecting nanowires,
   wherein each of the two intersecting nanowires has a triangular cross-sectional shape,
   wherein the two intersecting nanowires are arranged in a single plane and form a cross-shaped structure, and
   wherein the capture point is disposed at an intersection region of the two intersecting nanowires.

2. The apparatus according to claim 1, wherein a first metal layer and a second metal layer are disposed on the dielectric layer above one of the two intersecting nanowires and on either side of the intersection region thereby forming a pair of metal layers, wherein the pair of metal layers forms an antenna.

3. The apparatus according to claim 1, wherein at least one section of at least one nanowire has a different width and/or height than the rest of this nanowire.

4. The apparatus according to claim 2, wherein a third metal layer and a fourth metal layer are disposed on the dielectric layer above the other of the two intersecting nanowires and on either side of the intersection region thereby forming a second pair of metal layers, wherein the second pair of metal layers further forms the antenna.

5. The apparatus according to claim 2, wherein the first and second metal layers are first and second metal platelets.

6. The apparatus according to claim 5, wherein the first and second metal platelets are formed from vapor-deposition.

7. The apparatus according to claim 2, wherein the capture point is generated by laser light, and wherein the antenna focuses the laser light onto the intersection region.

8. The apparatus according to claim 1, wherein the bias voltage is configured shift a conductive region of the two intersecting nanowires towards a tip of the triangular cross-sectional intersecting nanowires.

9. The apparatus according to claim 1, further comprising at least one additional nanowire that intersects each of the two intersecting nanowires.

10. The apparatus according to claim 1, wherein a gate of the field effect transistor is formed by the liquid sample and an electrode configured to apply a voltage to the liquid sample.

* * * * *